(12) United States Patent
Wu et al.

(10) Patent No.: US 12,740,100 B2
(45) Date of Patent: Sep. 15, 2026

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Yung-Chun Wu, Hsinchu City (TW); Yi-Ju Yao, New Taipei City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 719 days.

(21) Appl. No.: 18/194,379

(22) Filed: Mar. 31, 2023

(65) Prior Publication Data

US 2024/0332386 A1 Oct. 3, 2024

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/024* (2025.01); (Continued)

(58) Field of Classification Search
CPC ............... H10D 30/797; H10D 62/151; H10D 84/0172; H10D 84/856
See application file for complete search history.

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

TW 202240911 A 10/2022
TW 202242972 A 11/2022

OTHER PUBLICATIONS

G. Hellings et al., "Si/SiGe superlattice I/O finFETs in a vertically-stacked Gate-All-Around horizontal Nanowire Technology," 2018 IEEE Symposium on VLSI Technology, 2018, pp. 85-86.
(Continued)

*Primary Examiner* — Fernando L Toledo
*Assistant Examiner* — Adam S Bowen
(74) *Attorney, Agent, or Firm* — Maschoff Brennan

(57) ABSTRACT

A method includes forming an epitaxial stack over a semiconductor substrate, wherein the epitaxial stack comprises a plurality of first semiconductor layers and a plurality of second semiconductor layers alternately arranged over the semiconductor substrate, wherein the first semiconductor layers have a lower germanium concentration than a germanium concentration of the second semiconductor layers; patterning the epitaxial stack into a fin; forming a gate structure over a channel region of the fin, wherein the gate structure is in contact with the first semiconductor layers and the second semiconductor layers within the channel region of the fin; and forming source/drain regions on opposite sides of the channel region of the fin.

20 Claims, 34 Drawing Sheets

(51) Int. Cl.

| | |
|---|---|
| ***H10D 30/43*** | (2025.01) |
| ***H10D 30/62*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.

CPC ......... *H10D 30/43* (2025.01); *H10D 30/6211* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0193* (2025.01); *H10D 84/038* (2025.01); *H10D 84/853* (2025.01)

(56) References Cited

U.S. PATENT DOCUMENTS

| | | | | |
|---|---|---|---|---|
| 9,209,247 | B2 | 12/2015 | Colinge et al. | |
| 9,214,555 | B2 | 12/2015 | Oxland et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 2019/0355723 | A1* | 11/2019 | Miao | H10D 62/121 |
| 2020/0251474 | A1* | 8/2020 | Reznicek | H10D 30/751 |

OTHER PUBLICATIONS

Yan-Lin Li et al., "Improved Electrical Characteristics of Bulk FinFETs With SiGe Super-Lattice-Like Buried Channel," IEEE Electron Device Letters, vol. 40, No. 2, Feb. 2019, pp. 181-184.

"Elemental Semiconductors" retrieved from https://warwick.ac.uk/fac/sci/physics/current/postgraduate/regs/mpagswarwick/ex5/intro/elemental/, and retrieved on Mar. 30, 2023.

Ming-Hsin Cheng et al., "Strain Studies of Silicon-Germanium Hetero-Epitaxial Layer by X-ray Reciprocal Space Mapping," Instruments Today, vol. 29, Issue 1, 2007.

* cited by examiner

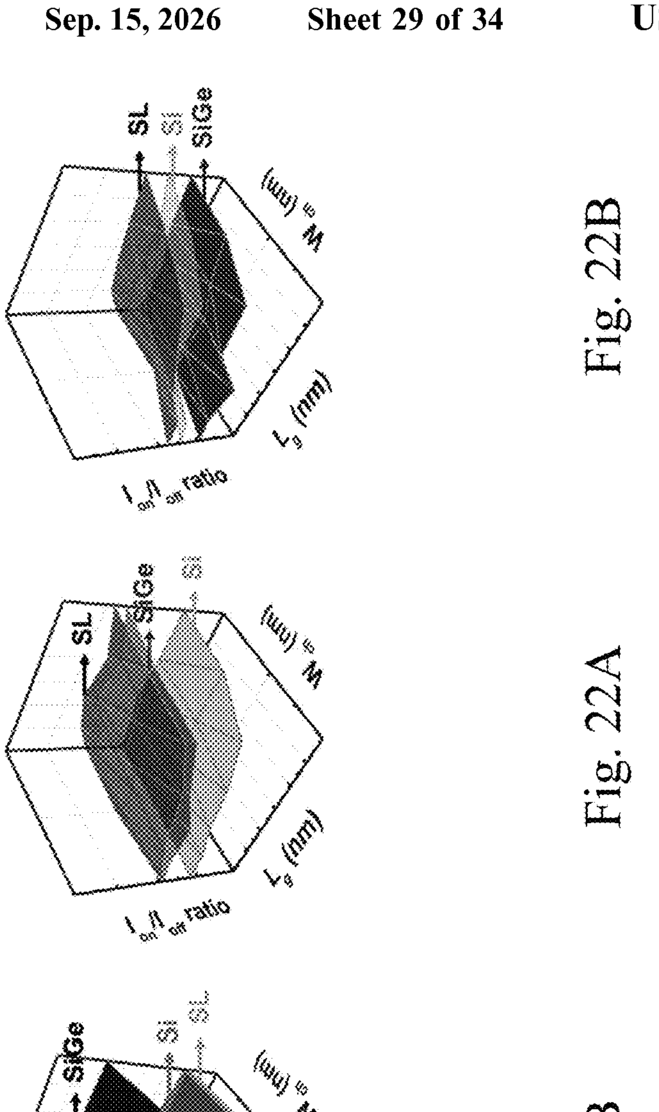
Fig. 22B
Fig. 22A
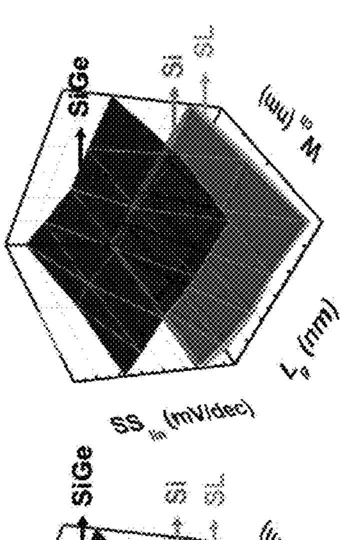
Fig. 21B
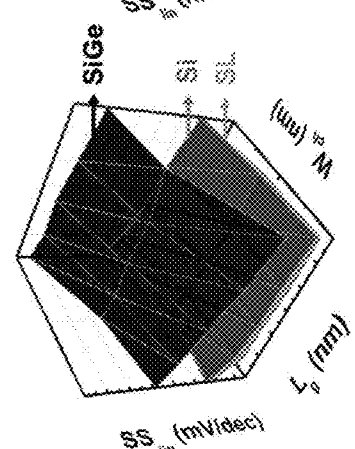
Fig. 21A

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 21A is a statistic three-dimensional (3D) contour plot of $SS_{LIN}$ versus gate length ($L_g$) and channel width ($W_{ch}$) of p-type transistors with different channel materials in accordance with some embodiments of the present disclosure.

FIG. 21B is a statistic 3D contour plot of $SS_{LIN}$ versus $L_g$ and $W_{ch}$ of n-type transistors with different channel materials in accordance with some embodiments of the present disclosure.

FIG. 22A is a statistic 3D contour plot of $I_{ON}/I_{OFF}$ ratio versus $L_g$ and $W_{ch}$ of p-type transistors with different channel materials in accordance with some embodiments of the present disclosure.

FIG. 22B is a statistic 3D contour plot of $I_{ON}/I_{OFF}$ ratio versus $L_g$ and $W_{ch}$ of n-type transistors with different channel materials in accordance with some embodiments of the present disclosure.

DETAILED DESCRIPTION

Figure 1:
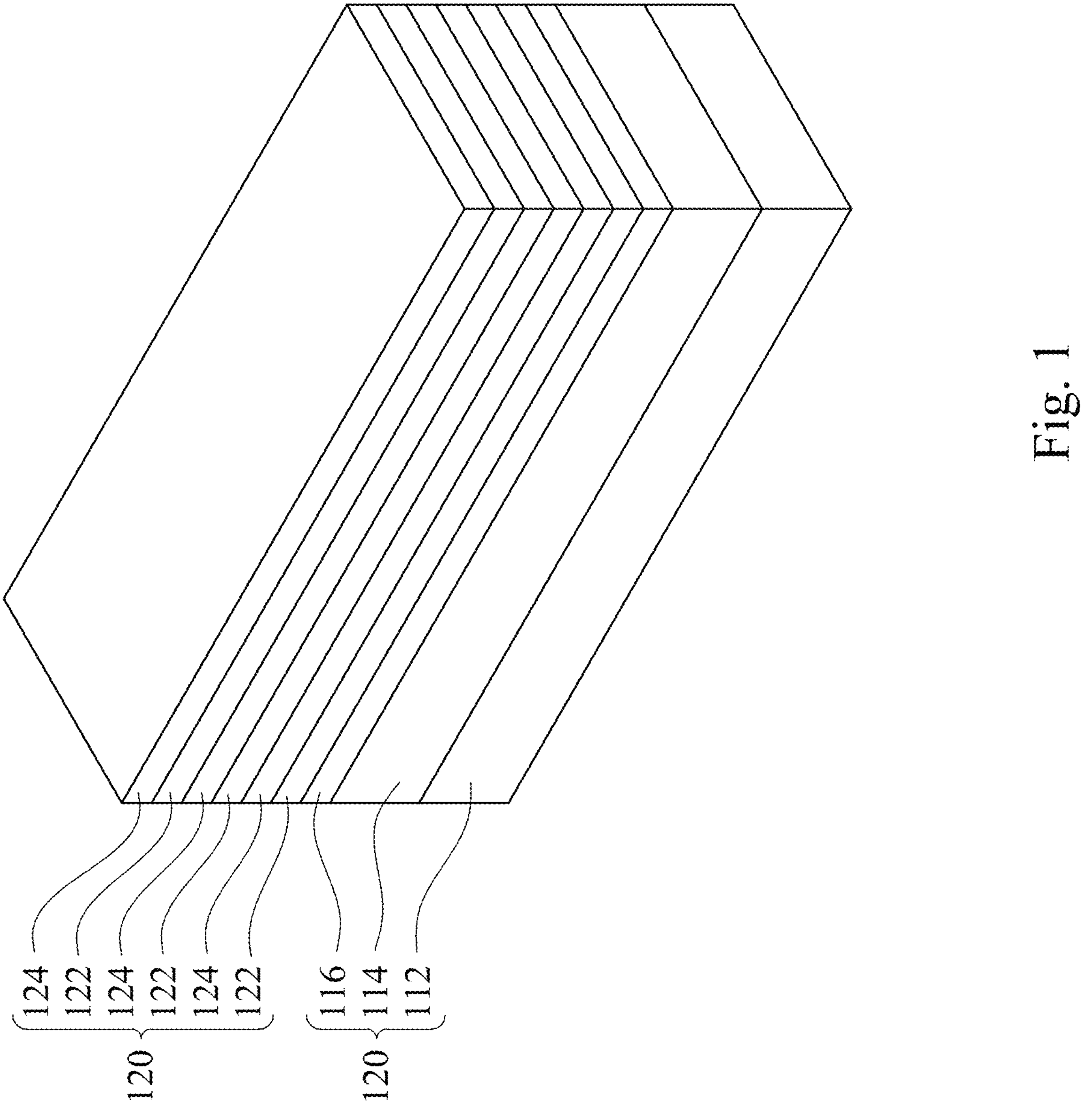
FIGS. 1-3B illustrate schematic views of intermediate stages in the manufacture of a fin field-effect transistor (FinFET) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

Figure 2A:
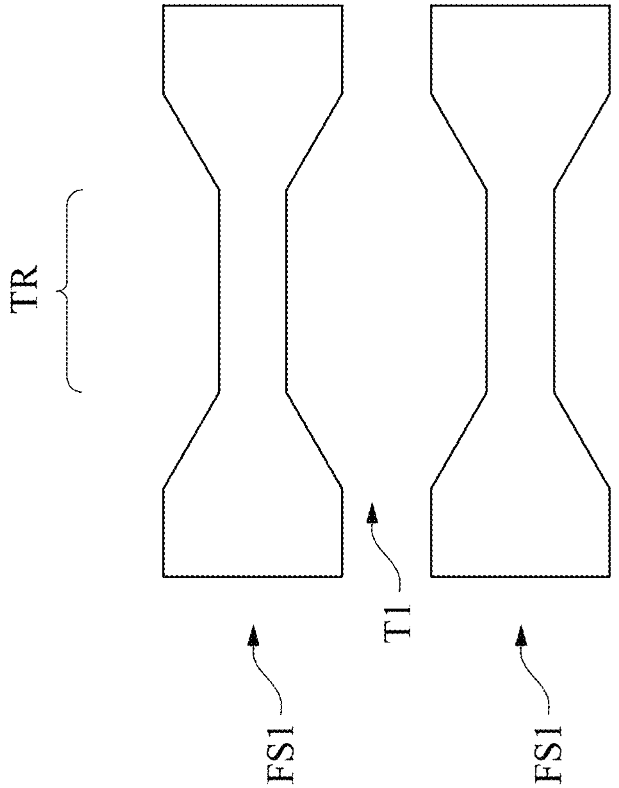
Figure 2B:
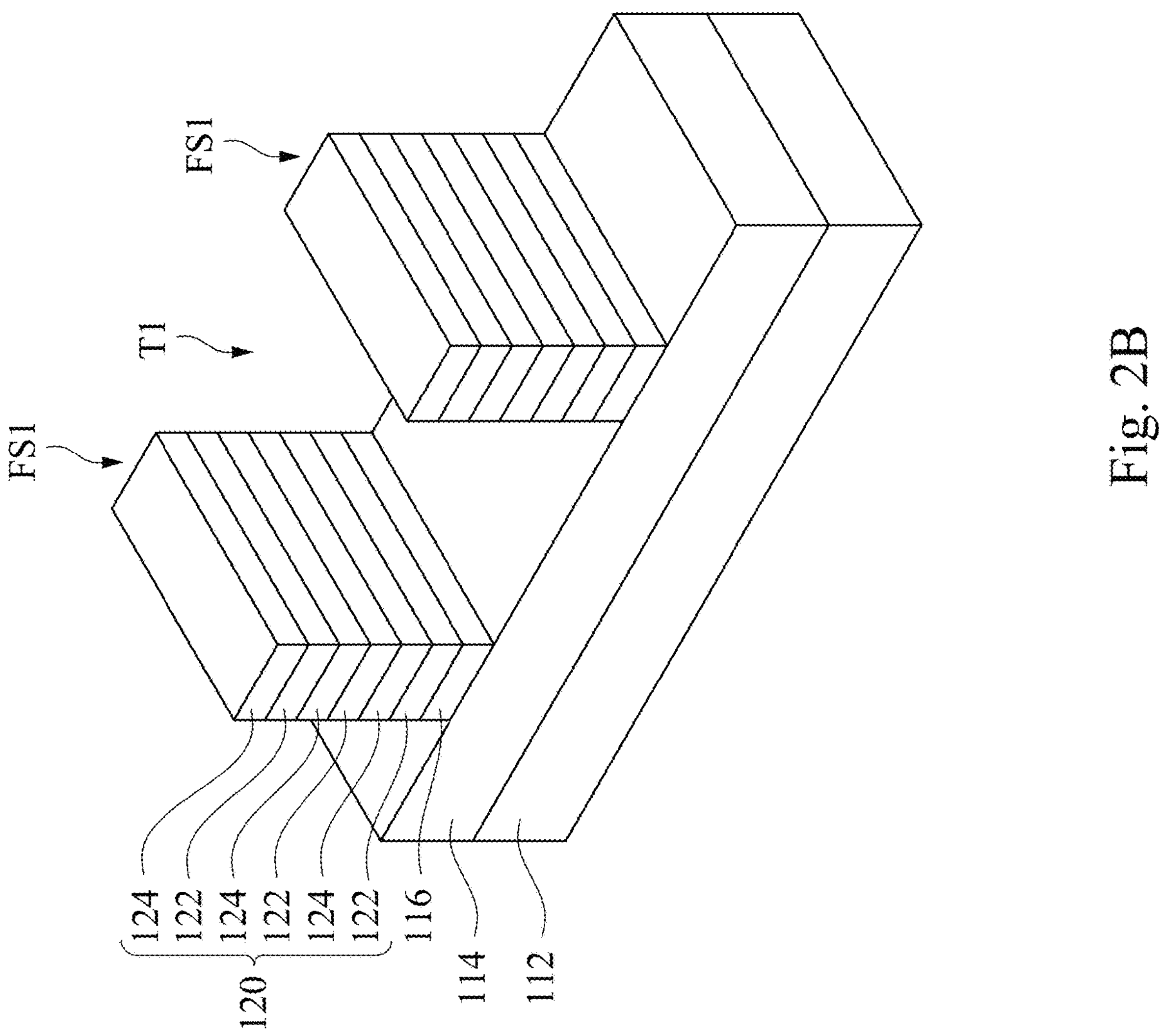
Figure 3A:
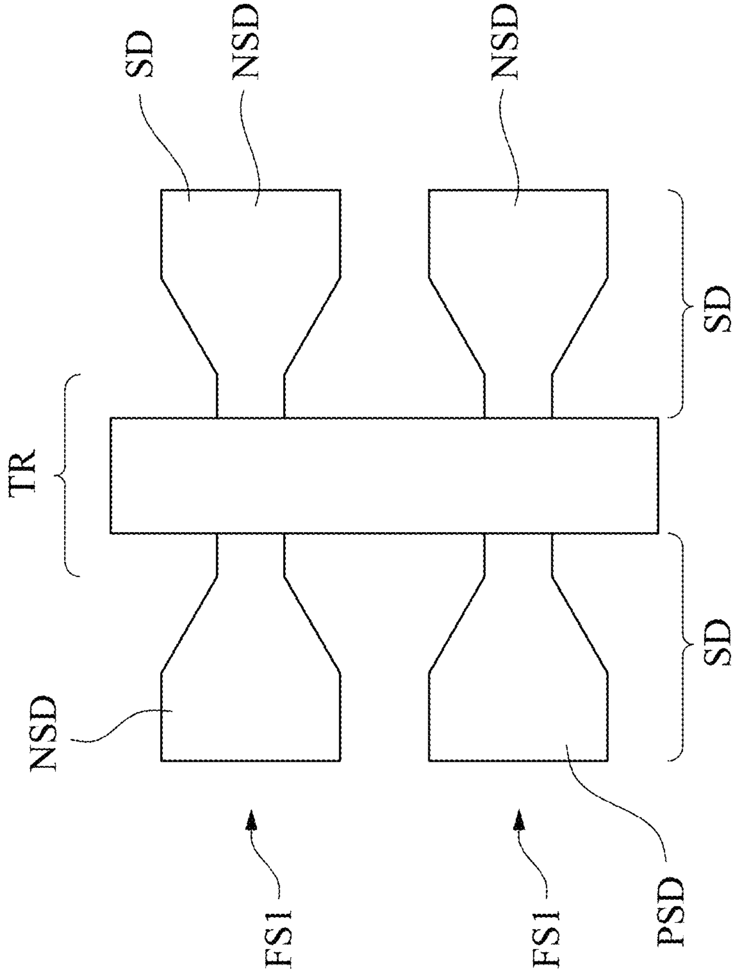
Figure 3B:
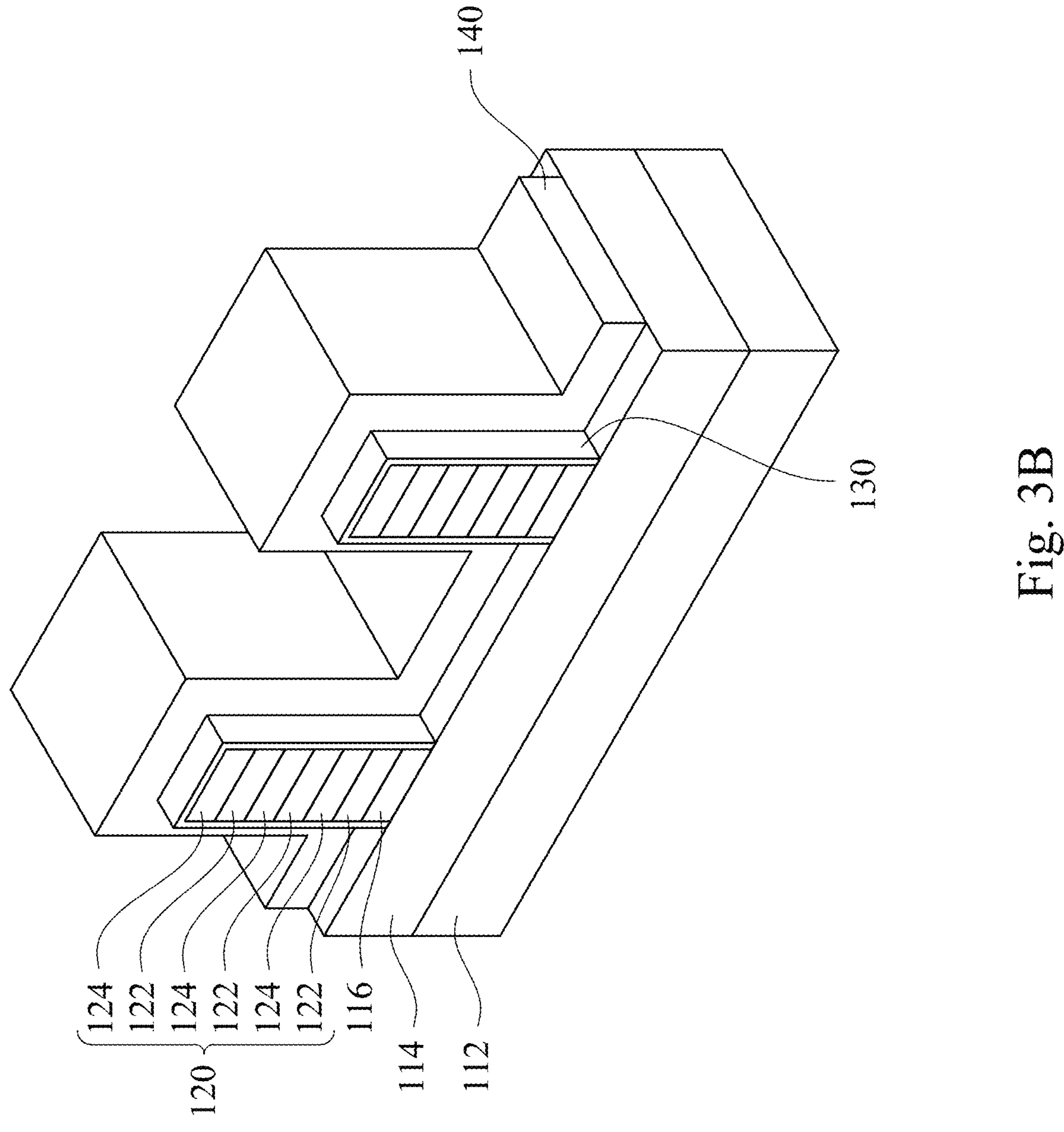

FIGS. 1-3B illustrate schematic views of intermediate stages in the manufacture of a fin field-effect transistor (FinFET) in accordance with some embodiments of the present disclosure. FIGS. 1, 2B, and 3B are schematic perspective views of the FinFET at various stages in accordance with some embodiments. FIGS. 2A and 3A are top views of the FinFET at various stages in accordance with some embodiments, in which the perspective views of FIGS. 1, 2B, and 3B are directed to a target region TR in FIGS. 2A and 3A. It is understood that additional steps may be provided before, during, and after the steps shown in FIGS. 1-3B, and some of the steps described below can be replaced or eliminated for additional embodiments of the method. The order of the operations/processes may be interchangeable.

Reference is made to FIG. 1. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer 114 between a semiconductor substrate 112 and a semiconductor layer 116. The semiconductor substrate 112 and the semiconductor layer 116 may include Si, Ge, SiGe, a III-V material (e.g., GaAs, GaP, GaAsP, AlInAs, AlGaAs, GaInAs, InAs, GaInP, InP. InSb, and/or GaInAsP; or a combination thereof) or other appropriate semiconductor materials. Also, the substrate 110 may include a buried dielectric layer 114 such as a buried oxide (BOX) layer, such as that formed by a method referred to as separation by implantation of oxygen (SIMOX) technology, wafer bonding, selective epitaxial growth (SEG), or another appropriate method. The semiconductor layer 116 may be a monocrystalline layer thinned down to have a thickness in a range from about 2 nanometers to about 6 nanometers.

The epitaxial stack 120 includes first epitaxial layers 122 interposed by second epitaxial layers 124. The epitaxial stack 120 may also be referred to as a multi-layer channel stack or multi-layer channel film. A thickness of the first epitaxial layers 122 and the second epitaxial layers 124 may be in a range from about 2 nanometers to about 6 nanometers. The first epitaxial layers 122 and the second epitaxial layers 124 may have different semiconductor compositions from each other. In some embodiments, the first epitaxial layers 122 and the second epitaxial layers 124 may include SiGe with different semiconductor compositions. For example, the second epitaxial layers 124 and the semiconductor layer 116 are $Si_{1-x}Ge_x$, and the first epitaxial layers 122 are $Si_{1-y}Ge_y$, in which x and y are in a range from 0 to 1, and $x<y$. In some embodiments, x is in a range from about 0 to about 0.1, and y is in a range from about 0.1 to about 0.4. For example, y can be in a range from about 0.2 to about 0.25. The Ge concentration of the first epitaxial layers 122 may be greater than the Ge concentration of the second epitaxial layers 124. In some embodiments, the semiconductor layer 116 and the second epitaxial layers 124 are Si layers, and the first epitaxial layers 122 are SiGe layers. In some embodiments, the Si concentration of the second epitaxial layers 124 may be same as the semiconductor layer 116 and greater than the Si concentration of the first epitaxial layers 122. In the present embodiments, the topmost one of the second epitaxial layers 124 (e.g., Si layer) serve as the topmost layer of the stack 120. By using the Si layer capping the stack 120, defects resulting from germanium thermal oxidation can be reduced.

The stack 120 including the SiGe layers 122 and Si layers 124 may be referred to a SiGe/Si super-lattice-like heterostructure. Clear separated the SiGe layers 122 and the Si layers 124 can be observed in the Energy-dispersive X-ray spectroscopy (EDX) mapping. Sharp diffraction patterns of nanobeam diffraction (NBD) can reveal that the SiGe layers 122 and the Si layers 124 are well epitaxial and single crystal.

It is noted that three layers of the first epitaxial layers 122 and three layers of the second epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120. In some embodiments, the number of epitaxial layers 124 is between 2 and 8. For example, the number of epitaxial layers 124 is 3 or 4. The first epitaxial layers 122 and the second epitaxial layers 124 may have a same thickness in some embodiments. In some alternative embodiments, the first epitaxial layers 122 may have a thickness greater or less than a thickness of the second epitaxial layers 124. In some embodiments, the SiGe epitaxial layers 122 may have a thickness greater than that of the Si epitaxial layers 124 for enhancing stability of SiGe film.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 122 and 124 include suitable semiconductor material, such as like Si, Ge, Sn, SiGe, GeSn, III-V semiconductor, the like, or the combination thereof. In some embodiments, the second epitaxial layers 124 may include a same semiconductor material as that of the semiconductor layer 116. In some embodiments, the epitaxially first epitaxial layers 122 include a different material than the semiconductor layer 116. For example, the first epitaxial layers 122 include suitable semiconductor material, such as SiGe. In some embodiments, the layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Reference is made to FIGS. 2A and 2B. A plurality of semiconductor fins FS1 extending from the substrate 110 are formed. In various embodiments, each of the fins FS1 includes a semiconductor portion formed from the semiconductor layer 116 and portions of each of the epitaxial layers 122 and 124.

The fins FS1 may subsequently be fabricated using suitable processes including photolithography and etch processes. The photolithography process may include forming a hard mask layer over the stack 120, forming a photoresist layer (not shown) over the hard mask layer, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the hard mask layer, through the epitaxial stack 120, and into the substrate 110, thereby leaving the plurality of extending fins FS1. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS1.

The fins FS1 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS1 by etching initial epitaxial stack 120. The etching process can include dry etching, wet etching, reactive ion etching (RIE), and/or other suitable processes.

Reference is made to FIGS. 3A and 3B. A gate dielectric layer 130 is formed around the fins FS1, and a gate electrode 140 is then formed over the gate dielectric layer 130. The gate dielectric layer 130 may be formed by suitable thermal oxidation process and/or deposition process. The gate dielectric layer 130 may include an interfacial oxide layer ($SiO_2$) formed by thermal oxidation. In some embodiments, the gate dielectric layer 130 may further include high-k dielectric layers, such as HZO, HfO2, the like, or the combination thereof, formed by CVD or ALD process. The gate dielectric layer 130 may extend along sidewalls of the epitaxial layers 122 and 124 and in contact with the topmost epitaxial layer 124 in the stack. A thickness of the gate dielectric layer 130 may be in a range from about 1 nanometer to about 10 nanometers.

The gate electrode 140 may be formed by a series of operations including film formation/deposition, photolithography patterning, and etching processes. The film formation/deposition process includes forming/depositing suitable gate metal materials over the substrate 110, by suitable methods (e.g., PVD, ALD, and/or the like). The gate metal materials may include suitable conductive materials, such as TiN, TaN, Ti, Ta, Al, W, Co, Ru, or other metals, combinations thereof, or multi-layers thereof. Alternatively, in some other embodiments, the gate metal materials may include doped polysilicon. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

After the formation of the gate electrode 140, source/drain regions SD may formed in the fins FS1, respectively on opposite sides of the gate electrode 140. In some embodiments, the source/drain regions SD may be formed by doping regions of the semiconductor fins FS1 (including the first epitaxial layers 122, the second epitaxial layers 124, and the semiconductor layer 116) uncovered by the gate electrode 140 with n-type or p-type dopants. The doped regions of the semiconductor fins FS1 (including the first epitaxial layers 122, the second epitaxial layers 124, and the semiconductor layer 116) may serve as the source/drain regions SD. Thus, a channel region of a fin FS1 below the gate electrode 140, the gate electrode 140, and the n-typed doped regions of the fin FS1 (denoted as n-typed source/drain regions NSD) may form an n-type FinFET. Thus, a channel region of a fin FS1 below the gate electrode 140, the gate electrode 140, and the p-typed doped regions of the fin FS1 (denoted as p-typed source/drain regions PSD) may form an p-type FinFET. A dopant concentration of the source/drain regions SD may be higher than that of the well regions in the semiconductor fins FS1. For example, the dosage for the source/drain doping process may be in a range from about $10^{14}$ $cm^{-2}$ to about $10^{18}$ $cm^{-2}$. In some other embodiments, the source/drain regions SD may be epitaxy structures, and may also be referred to as epitaxy features. The epitaxy structures may be formed using one or more epitaxy or epitaxial (epi) processes, such that Si features, SiGe features, and/or other suitable features can be formed in a crystalline state on the semiconductor fins. In some embodiments, the epitaxy structures may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP). The epitaxy structures may be in-situ doped. The doping species include p-type dopants, such as boron or $BF_2$; n-type dopants, such as phosphorus or arsenic; and/or other suitable dopants including combinations thereof. One or more annealing processes may be performed to activate the epitaxy structures.

In some embodiments of the present disclosure, the first epitaxial layers 122, the second epitaxial layers 124, and the semiconductor layer 116 in combination form a channel of a FinFET. In the context, the first epitaxial layers 122, the second epitaxial layers 124, and the semiconductor layer 116 may also be referred to as channel layers.

Figure 4A:
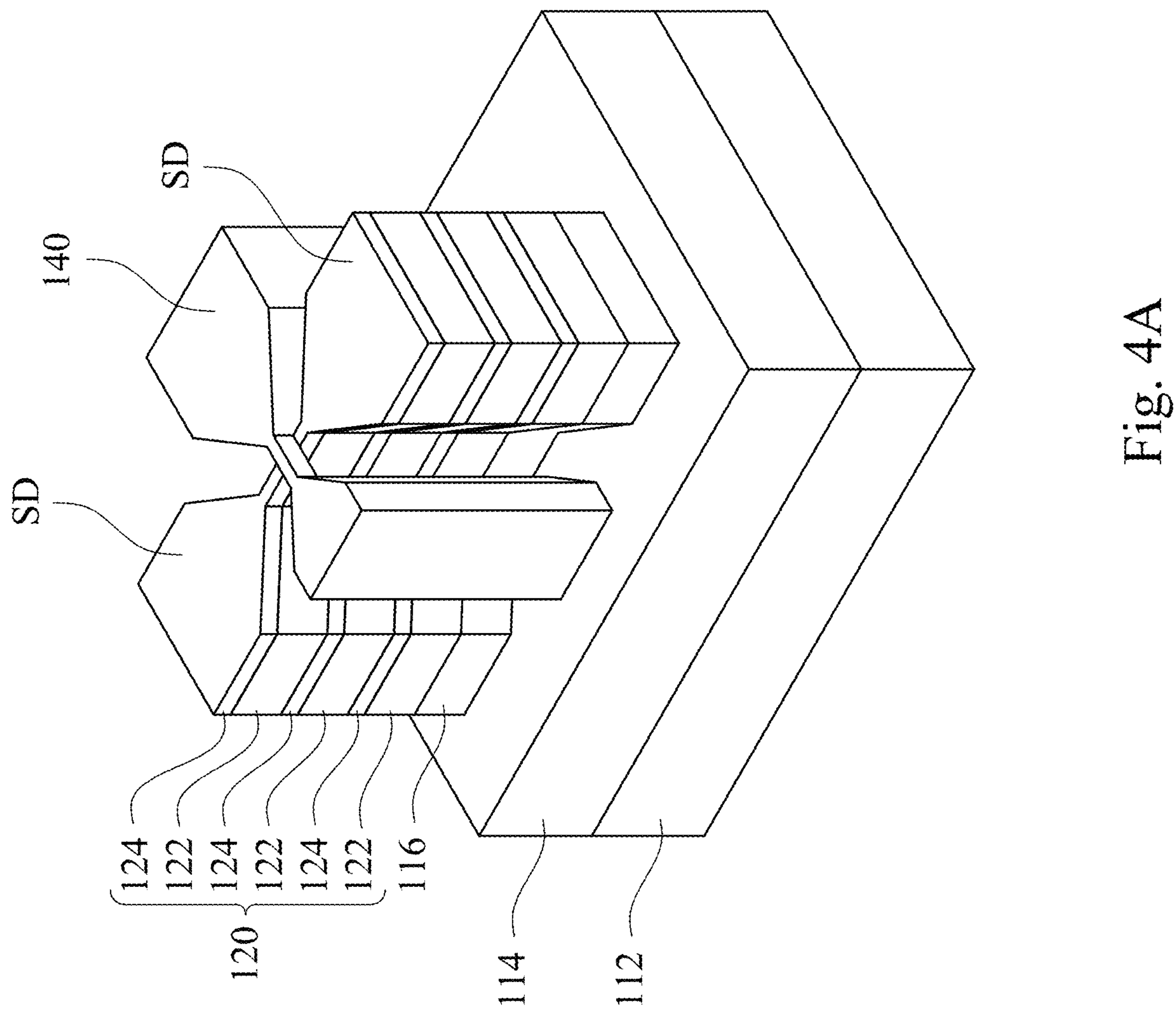
FIGS. 4A and 4B are schematic views of a FinFET in accordance with some embodiments of the present disclosure.
Figure 4B:
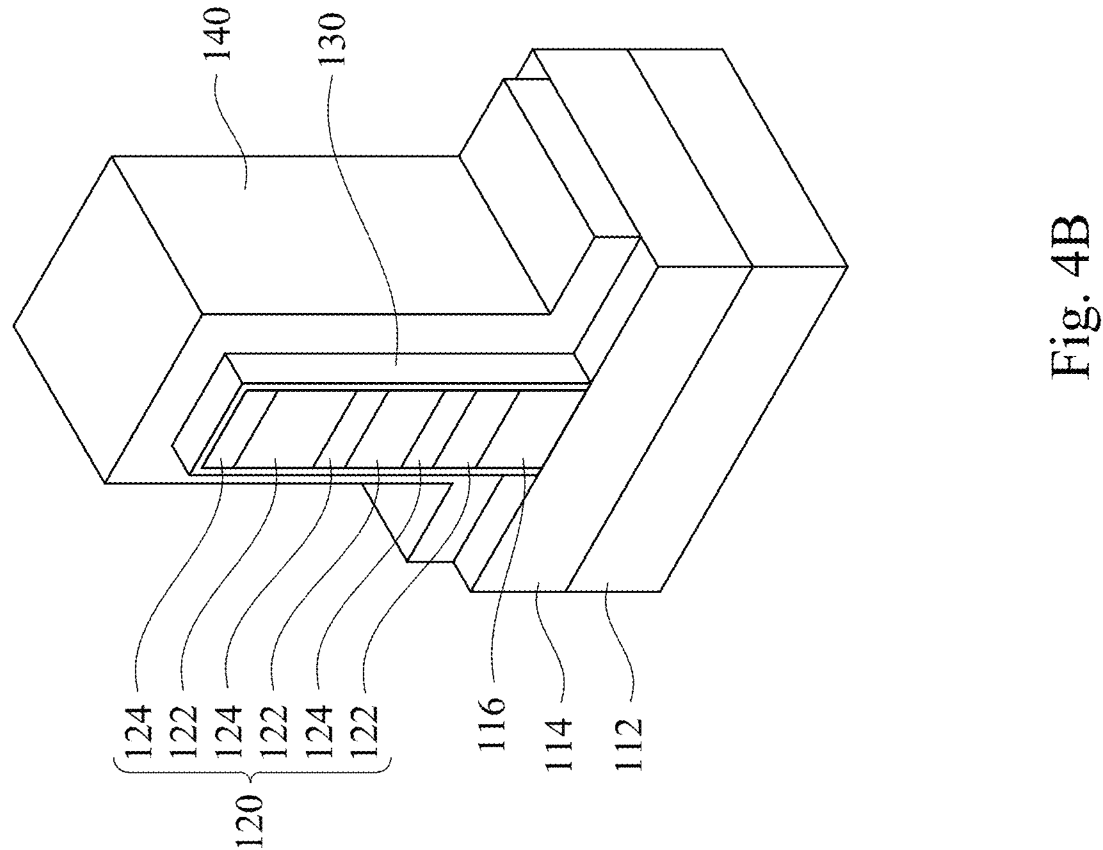

FIGS. 4A and 4B are schematic views of a FinFET in accordance with some embodiments of the present disclosure. Details of the present embodiments are similar to that of the embodiments of FIGS. 1-3B, except that the thicknesses of the first epitaxial layers 122 is greater than the thickness of the second epitaxial layers 124.

In the present embodiments, the thicknesses of the first epitaxial layers 122 may vary. For example, the thicknesses of the first epitaxial layers 122 increase from bottom to top. Stated differently, the thickness of the topmost first epitaxial layer 122 is greater than the thickness of the middle first epitaxial layer 122, and the thickness of the middle first epitaxial layer 122 is greater than the thickness of the bottommost first epitaxial layer 122. In some alternative embodiments, the thicknesses of the first epitaxial layers 122 increase from top to bottom. In the present embodiments, the second epitaxial layers 124 have substantially the same thickness. In some alternative embodiments, the thicknesses of the second epitaxial layers 124 may vary. For example, the thicknesses of the second epitaxial layers 124 may increase from bottom to top or increase from top to bottom. Other details of the present embodiments are similar to that of the embodiments of FIGS. 1-3B, and thereto not repeated herein.

Figure 5:
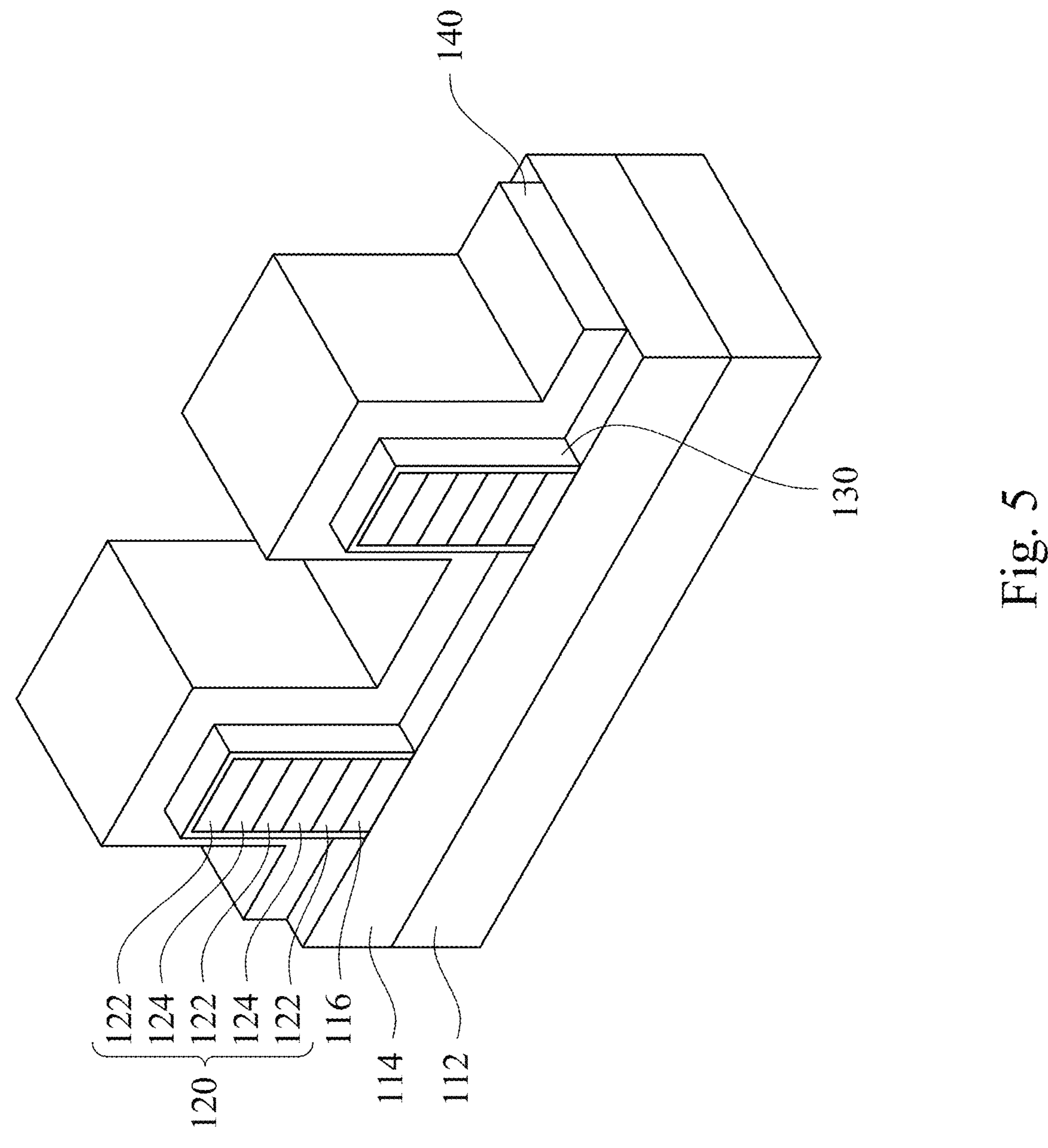
FIG. 5 illustrates a perspective view of a FinFET in accordance with some embodiments of the present disclosure.

FIG. 5 illustrates a perspective view of a FinFET in accordance with some embodiments of the present disclosure. Details of the present embodiments are similar to that of the embodiments of FIGS. 1-3B, except that the topmost one of the first epitaxial layers 122 (e.g., SiGe layer) serve as the topmost layer of the stack 120. The gate dielectric layer 130 may extend along sidewalls of the epitaxial layers 122 and 124 and in contact with a top surface of the topmost epitaxial layer 122 in the stack 120. Other details of the present embodiments are similar to that of the embodiments of FIGS. 1-3B, and thereto not repeated herein.

Figure 6:
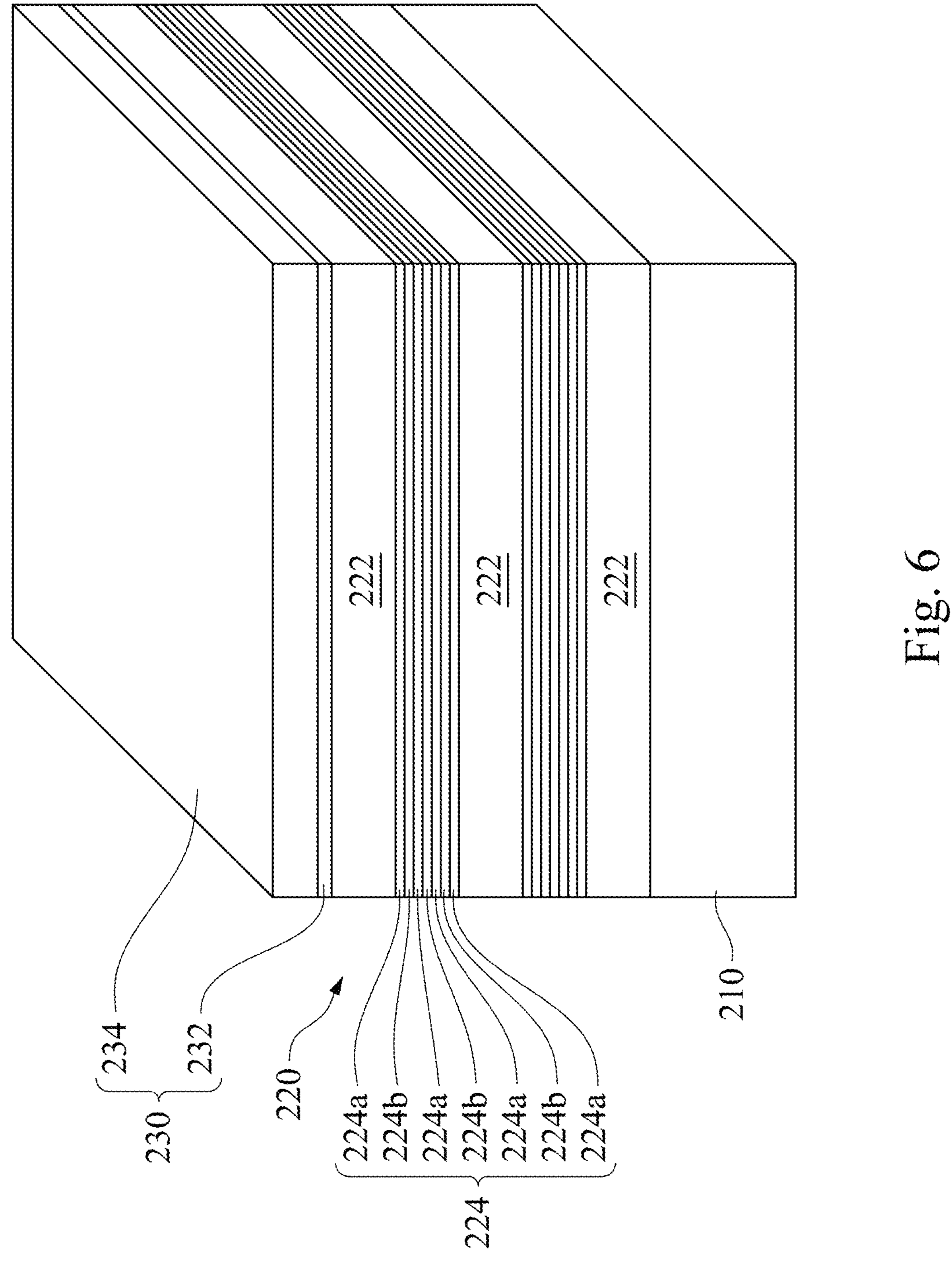
FIGS. 6-13C illustrate schematic views of intermediate stages in the manufacture of a gate all around (GAA) transistor in accordance with some embodiments of the present disclosure.
Figure 7:
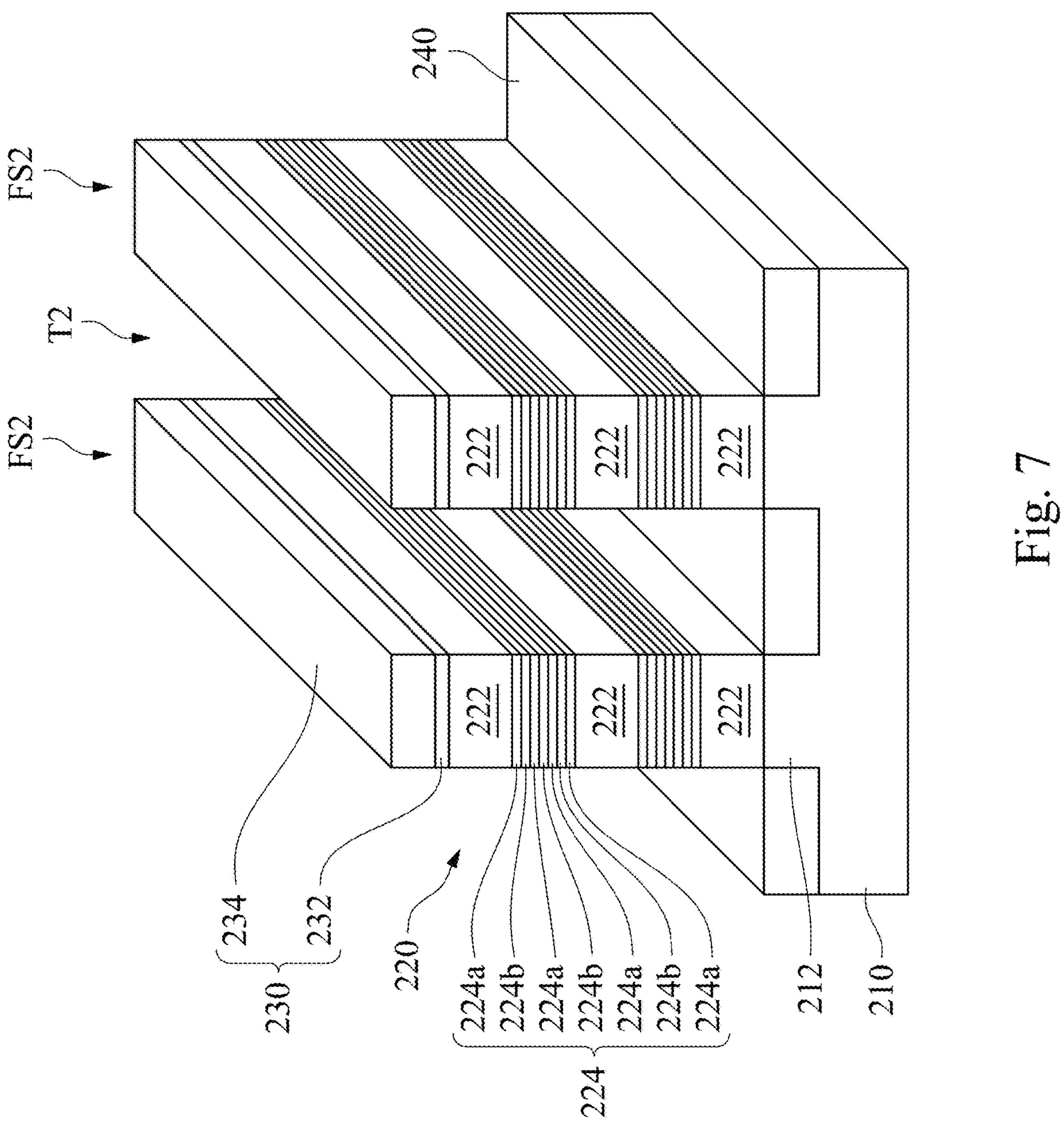
Figure 11:
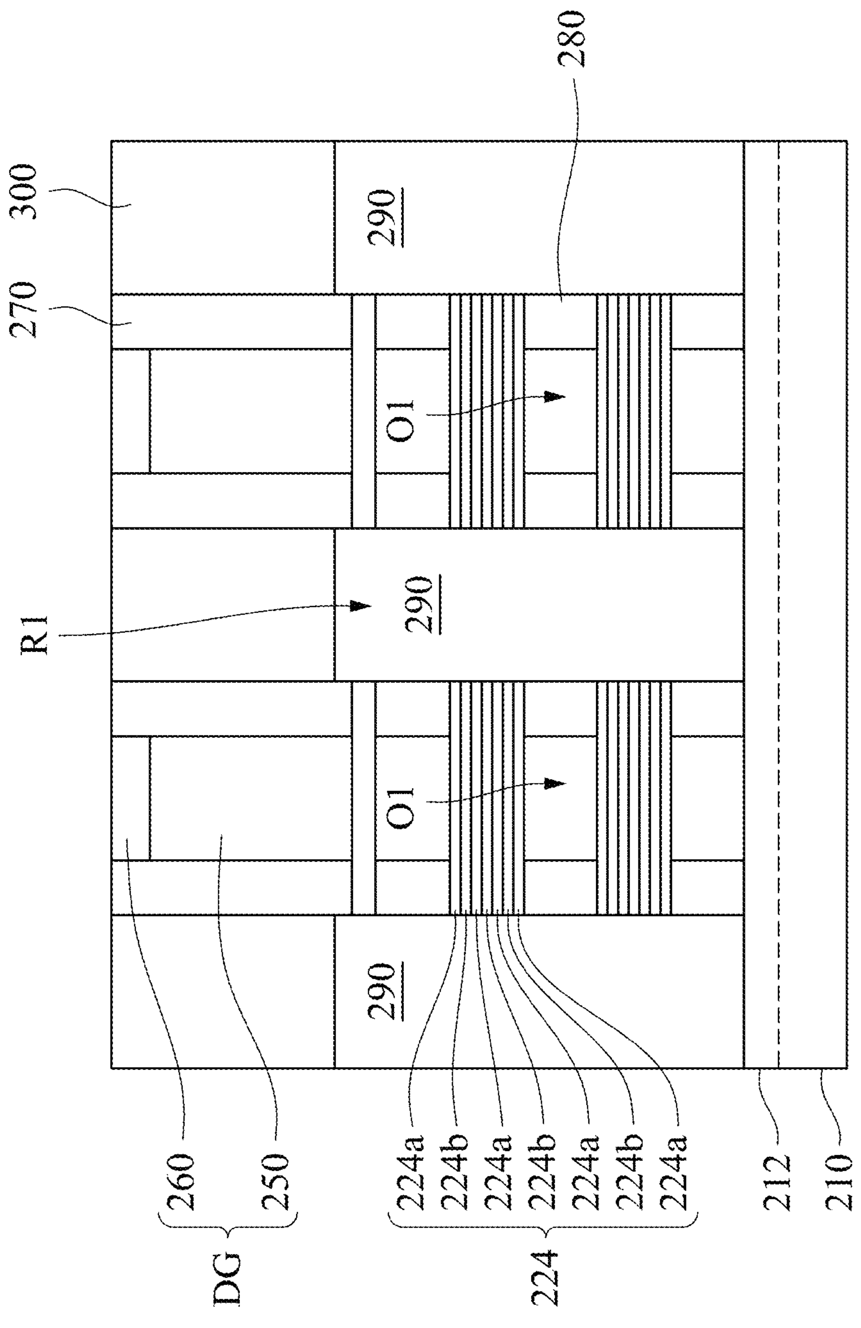
Figure 12A:
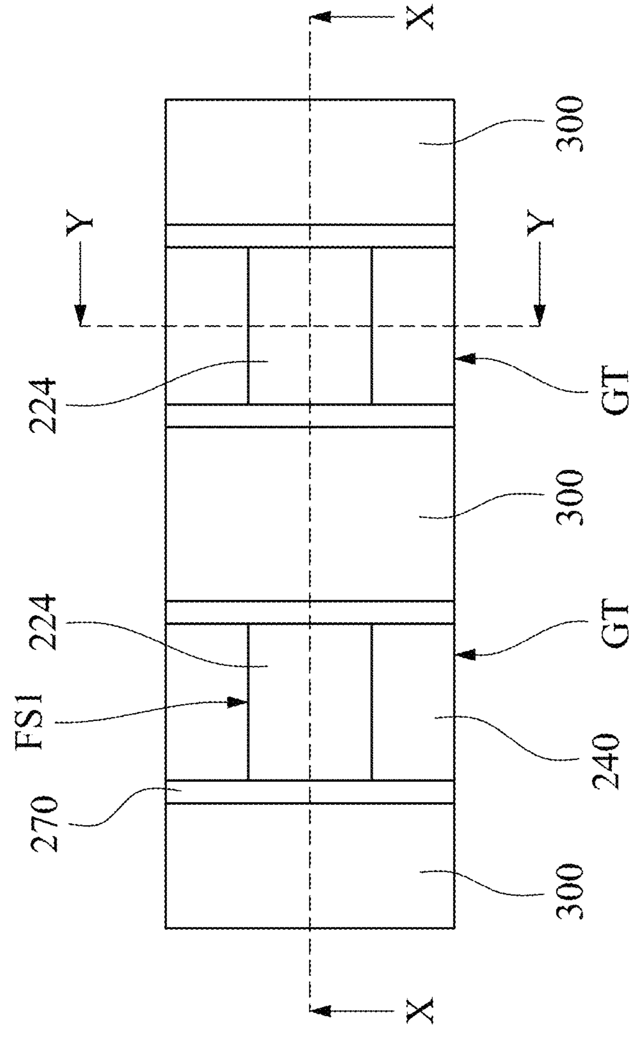
Figure 12B:
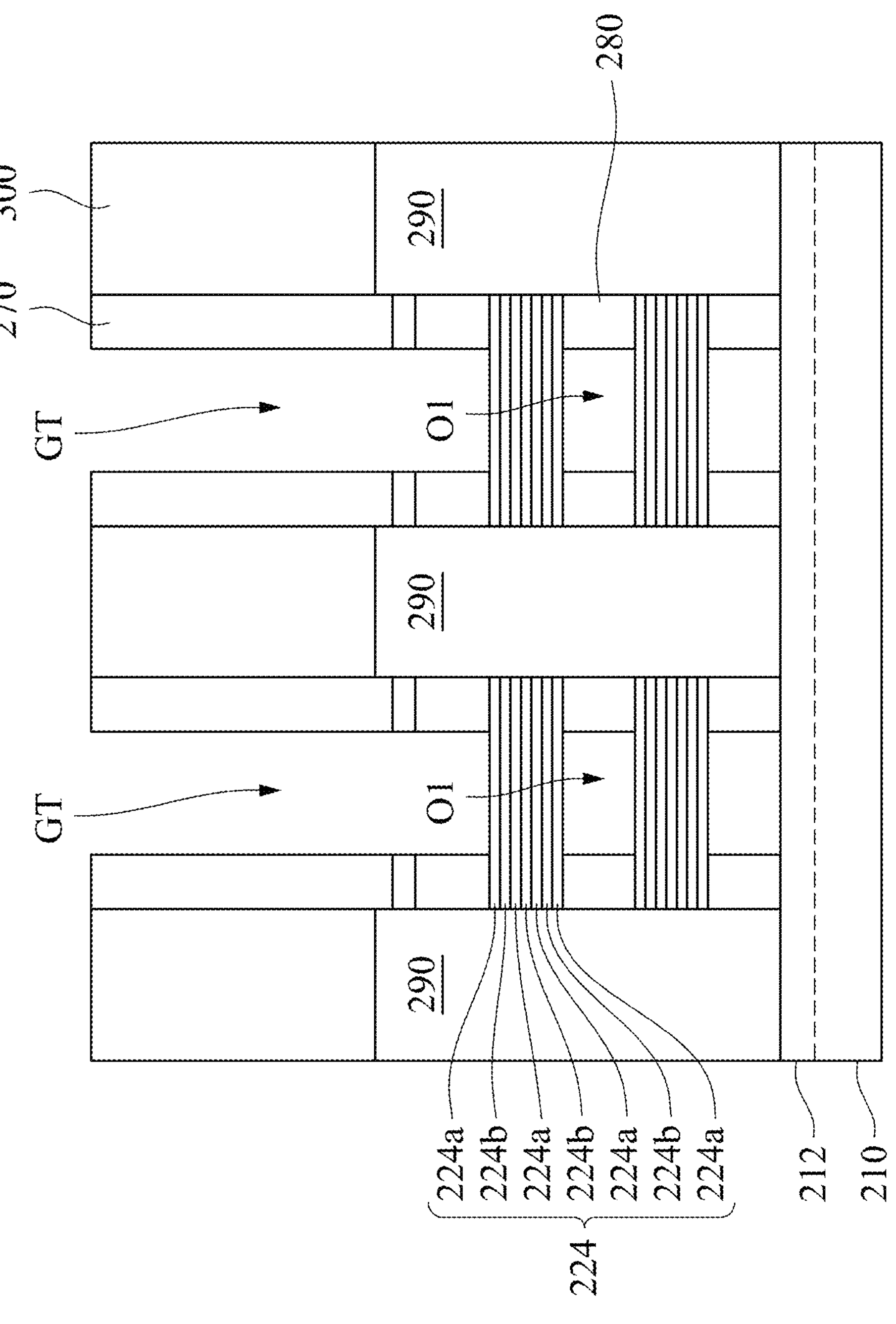
Figure 12C:
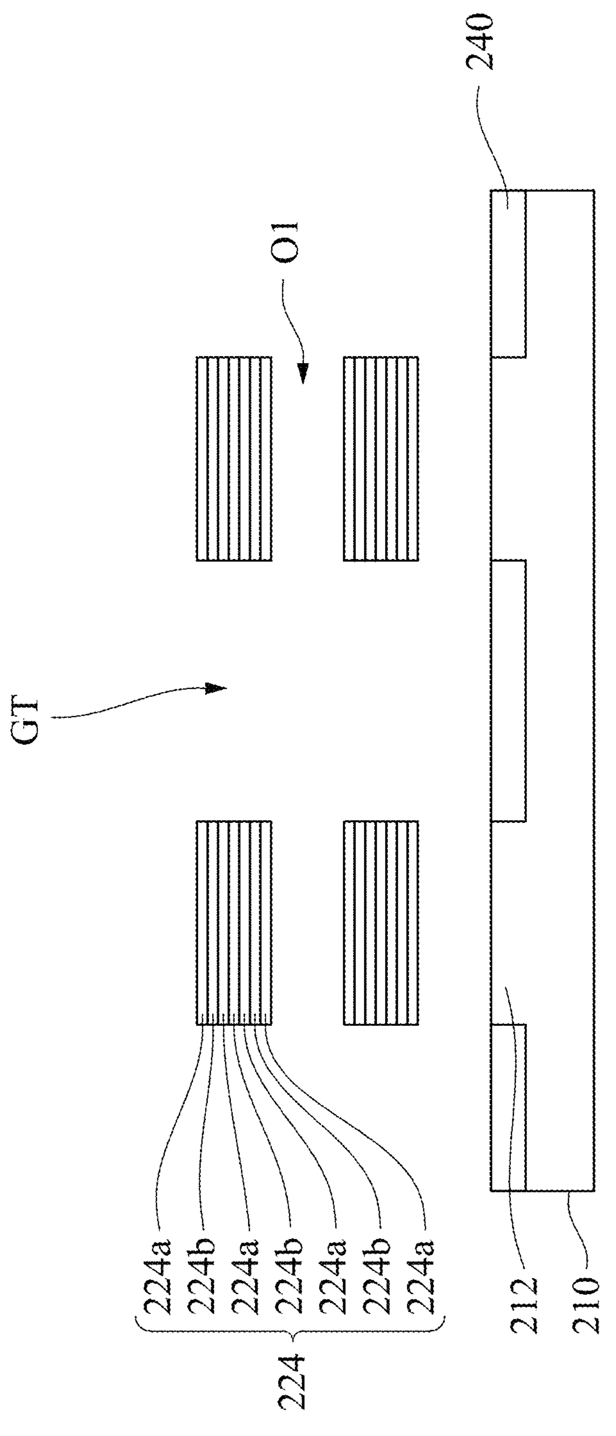
Figure 13A:
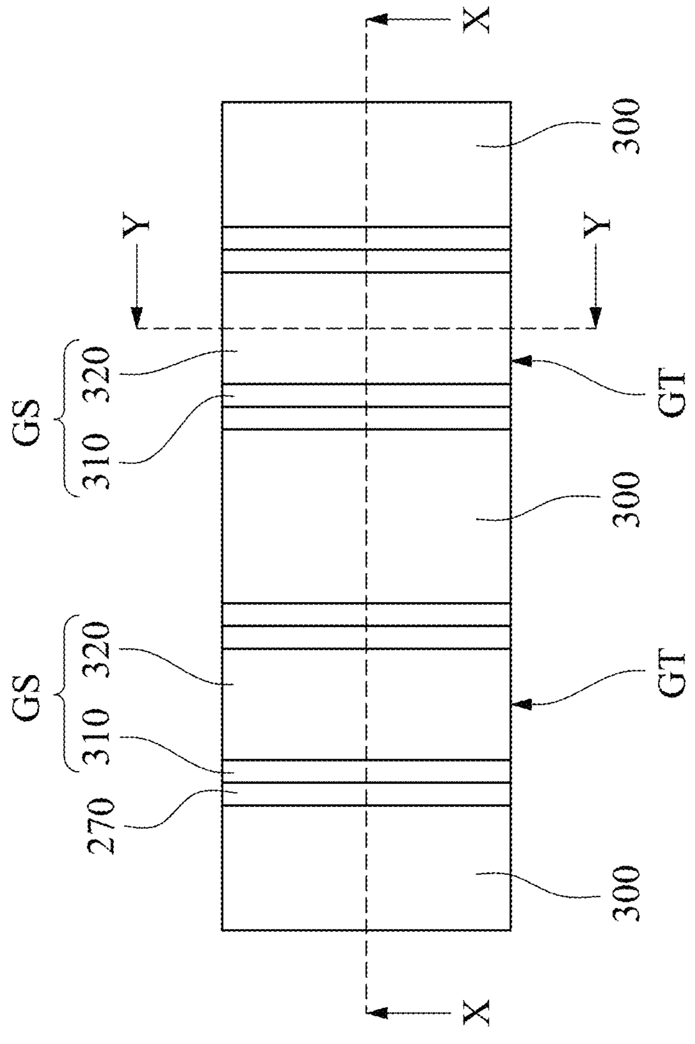
Figure 13B:
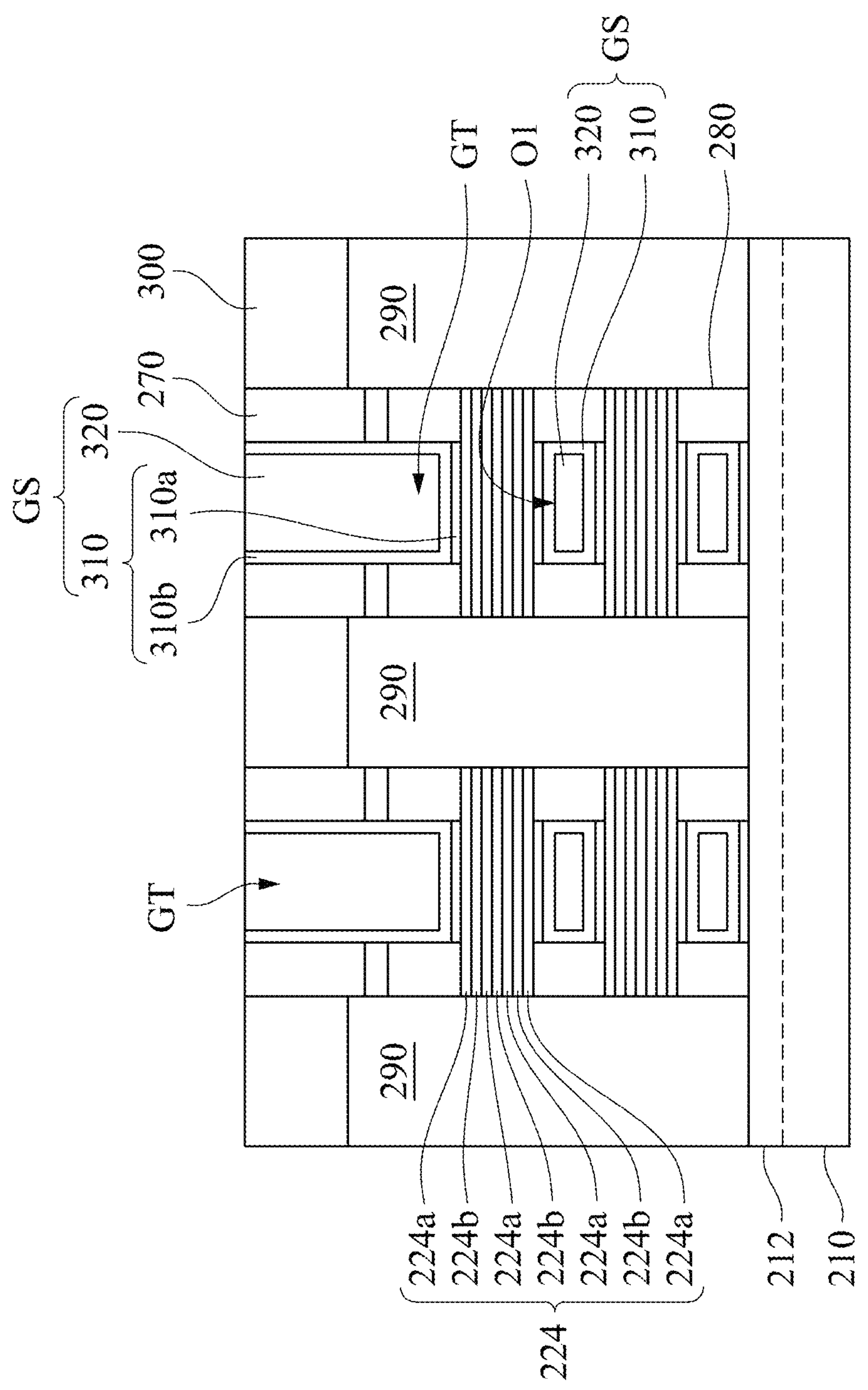
Figure 13C:
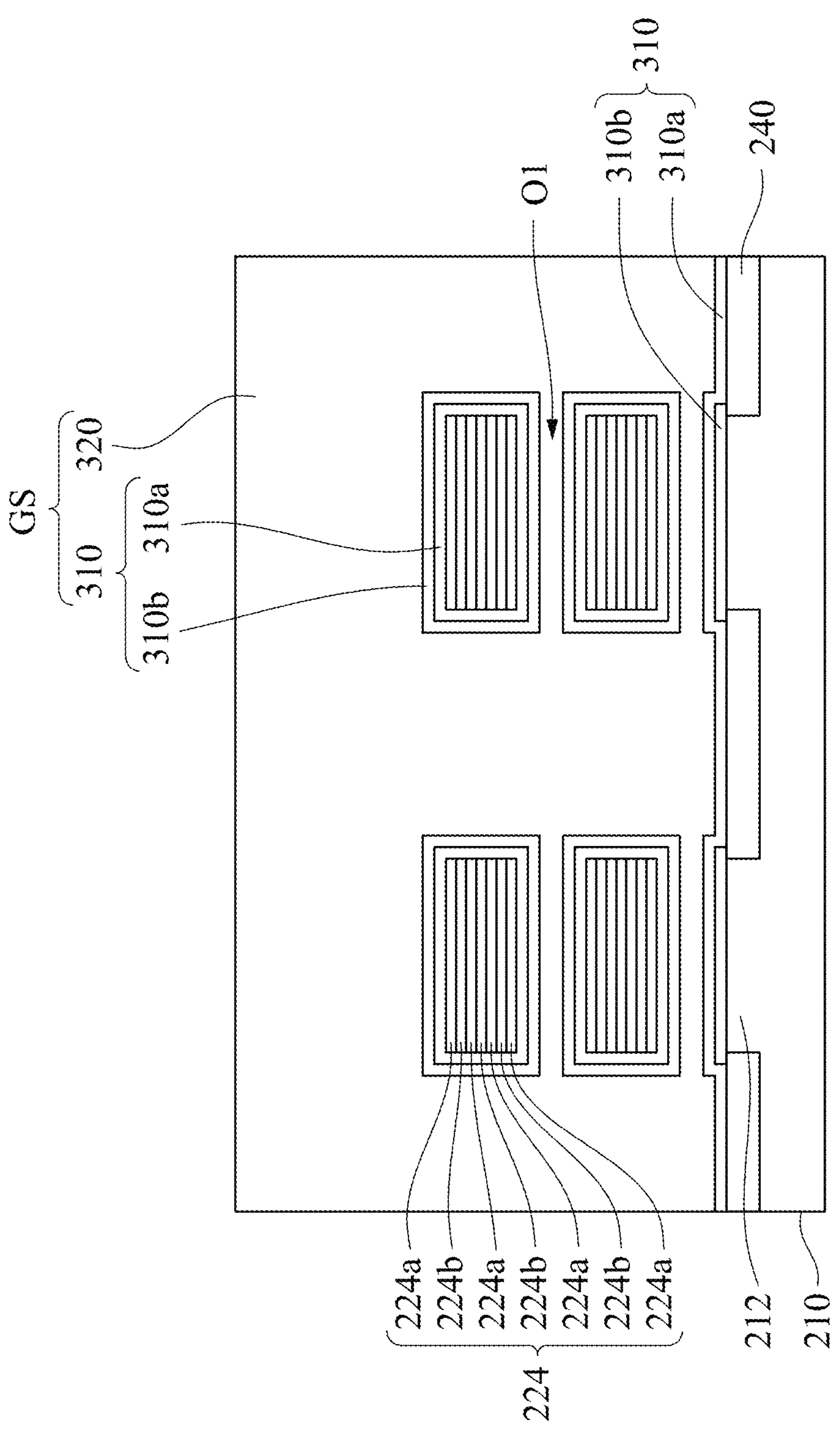

FIGS. 6-13C illustrate schematic views of intermediate stages in the manufacture of a GAA transistor in accordance with some embodiments of the present disclosure. FIGS. 6 and 7 are schematic perspective views of the GAA transistor at various stages in accordance with some embodiments. FIGS. 8A, 12A, and 13A are top views of the GAA transistor at various stages in accordance with some embodiments. FIGS. 8B, 9, 10, 11, 12B, and 13B are cross-sectional views of the GAA transistor (e.g., taken along line X-X in FIGS. 8A, 12A, and 13A) at various stages in accordance with some embodiments. FIGS. 8C, 12C, and 13C are cross-sectional views of the GAA transistor (e.g., taken along line Y-Y in FIGS. 8A, 12A, and 13A) at various stages in accordance with some embodiments. It is understood that additional steps may be provided before, during, and after the steps shown in FIGS. 6-13C, and some of the steps described below can be replaced or eliminated for additional embodiments of the method. The order of the operations/processes may be interchangeable.

Reference is made to FIG. 6. An epitaxial stack 220 is formed over a substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also, the substrate 210 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 220 includes epitaxial layers 222 interposed by epitaxial layers 224. In the context, the epitaxial layers 222 may also be referred to as sacrificial layers 222, and the epitaxial layers 224 may also be referred to as multi-layer channel films 224. The epitaxial layers 224 may also be referred to as multi-layer channel stacks. In some embodiments, each of the multi-layer channel films 224 includes epitaxial channel layers 224*a* and 224*b* alternatively arranged in a vertical direction. A thickness of the channel layers 224*a* and the channel layers 224*b* may be in a range from about 2 nanometers to about 6 nanometers. The channel layers 224*a*, the channel layers 224*b*, and the sacrificial layers 222 may have different semiconductor compositions from each other. For example, the channel layers 224*a* are $Si_{1-x}Ge_x$, the channel layers 224*b* are $Si_{1-y}Ge_y$, and the sacrificial layers 222 are $Si_{1-z}Ge_z$, in which x, y, z are in a range from 0 to 1, and $x<y<z$. In some embodiments, x is in a range from about 0 to about 0.1, y is in a range from about 0.1 to about 0.4, and z is in a range from about 0.6 to about 1. For example, y can be in a range from about 0.2 to about 0.25. However, other embodiments are possible including those that provide for the material/compositions having different oxidation rates and/or etch selectivity. In some embodiments where the sacrificial layers 222 include SiGe with a greater Ge concentration and the channel layers 224*a* and 224*b* include Si and SiGe with a lower Ge concentration, the oxidation rate of the channel layers 224*a* and 224*b* is less than the oxidation rate of the sacrificial layers 222. The Ge concentration of the channel layers 224*b* may be greater than the Ge concentration of the channel layers 224*a*. In some embodiments, the channel layers 224*a* are Si layers, and the channel layers 224*b* are SiGe layers. And, the multi-layer channel films 224 including channel layers 224*a* and channel layers 224*b* may be referred to a SiGe/Si super-lattice-like heterostructure. In some embodiments, the Si concentration of the channel layers 224*a* may be greater than the Si concentration of the channel layers 224*b*. In the present embodiments, the topmost epitaxial layer of the stack 220 is the channel layer 224*a* (e.g., Si layer). By using the Si layer capping the stack 220, defects resulting from germanium thermal oxidation can be reduced.

The channel layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the channel layers 224 to define a channel or channels of a device is further discussed below.

It is noted that three layers of the sacrificial layers 222 and two layers of the channel layers 224 are alternately arranged as illustrated in FIG. 1, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of channel layers 224 is between 2 and 10. The sacrificial layers 222 in channel regions(s) may eventually be removed and serve to define a vertical distance between adjacent channel region(s) for a subsequently-formed multi-gate device.

It is noted that four layers of the channel layers 224*a* and three layers of the channel layers 224*b* are alternately arranged as illustrated in FIG. 6, which is for illustrative purposes only and not intended to be limiting beyond what is specifically recited in the claims. It can be appreciated that any number of epitaxial layers can be formed in the multi-layer channel film 224. In some embodiments, the number of channel layers 224*a*/224*b* is between 2 and 8. For example, the number of channel layers 224*a*/224*b* is 3 or 4. If the number of channel layers is too large, it is disadvantage for reducing size and stacking, and bending and defects may occur. If the number of channel layers is too small, the strain force of the superlattice structure may not obviously enhance the mobility. The channel layers 224*a* and 224*b* may have a same thickness in some embodiments. In some alternative embodiments, the first channel layers 224*a* may have a thickness greater or less than a thickness of the second channel layers 224*b*. In some embodiments, the SiGe channel layers 224*b* may have a thickness greater than that of the Si channel layers 224*a* for enhancing stability of SiGe film.

By way of example, epitaxial growth of the layers of the stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include suitable semiconductor material, such as like Si, Ge, Sn, SiGe, GeSn, III-V semiconductor, the like, or the combination thereof. In some embodiments, the channel layers 224*a* may include a same semiconductor material as that substrate 210. In some embodiments, the epitaxially grown sacrificial layers 222 and the channel layers 224*b* include a different material than the substrate 210. For example, the sacrificial layers 222 and the channel layers 224*b* include suitable semiconductor material, such as SiGe. In some embodiments, the channel layers 224*a*. 224*b*, and the sacrificial layers 222 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Reference is made to FIG. 7. A plurality of semiconductor fins FS2 extending from the substrate 210 are formed. In various embodiments, each of the fins FS2 includes a substrate portion 212 formed from the substrate 210 and portions of each of the epitaxial layers of the epitaxial stack 220 including epitaxial layers 222 and 224. The fins FS2 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS2 by etching initial epitaxial stack 220. The etching process can include dry etching, wet etching, reactive ion etching (RIE), and/or other suitable processes.

In the illustrated embodiments as illustrated in FIGS. 6 and 7, a hard mask (HM) layer 230 is formed over the epitaxial stack 220 prior to patterning the fins FS2. In some embodiments, the HM layer 230 includes an oxide layer 232 (e.g., a pad oxide layer that may include $SiO_2$) and a nitride layer 234 (e.g., a pad nitride layer that may include $Si_3N_4$) formed over the oxide layer. The oxide layer 232 may act as an adhesion layer between the epitaxial stack 220 and the nitride layer 234 and may act as an etch stop layer for etching the nitride layer 234. In some examples, the HM oxide layer 232 includes thermally grown oxide, chemical vapor deposition (CVD)-deposited oxide, and/or atomic layer deposition (ALD)-deposited oxide. In some embodiments, the HM nitride layer 234 is deposited on the HM oxide layer 232 by CVD and/or other suitable techniques.

The fins FS2 may subsequently be fabricated using suitable processes including photolithography and etch processes. The photolithography process may include forming a photoresist layer (not shown) over the HM layer 230, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 210, and layers formed thereupon, while an etch process forms trenches T2 in unprotected regions through the HM layer 230, through the epitaxial stack 220, and into the substrate 210, thereby leaving the plurality of extending fins FS2. The trenches T2 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins FS2.

Shallow trench isolation (STI) features 240 are formed interposing the fins FS2. By way of example and not limitation, a dielectric layer is first deposited over the substrate 210, filling the trenches T2 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, the dielectric layer (and subsequently formed STI features 240) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 230 functions as a CMP stop layer. The STI features 240 interposing the fins FS2 are recessed providing the fins FS2 extending above the STI features 240. In some embodiments, the recessing process may include a dry etching process, a wet etching process, and/or a combination thereof. The HM layer 230 may be removed before, during, and/or after the recessing of the STI features 240. The nitride layer 234 of the HM layer 230 may be removed, for example, by a wet etching process using $H_3PO_4$ or other suitable etchants. In some embodiments, the oxide layer 232 of the HM layer 230 is removed by the same etchant used to recess the STI features 240. In some embodiments, a recessing depth is controlled (e.g., by controlling an etching time) so as to result in a desired height of the exposed upper portion of the fins FS2. In the illustrated embodiments, the desired height exposes each of the layers of the epitaxial stack 220 in the fins FS2.

Figure 8A:
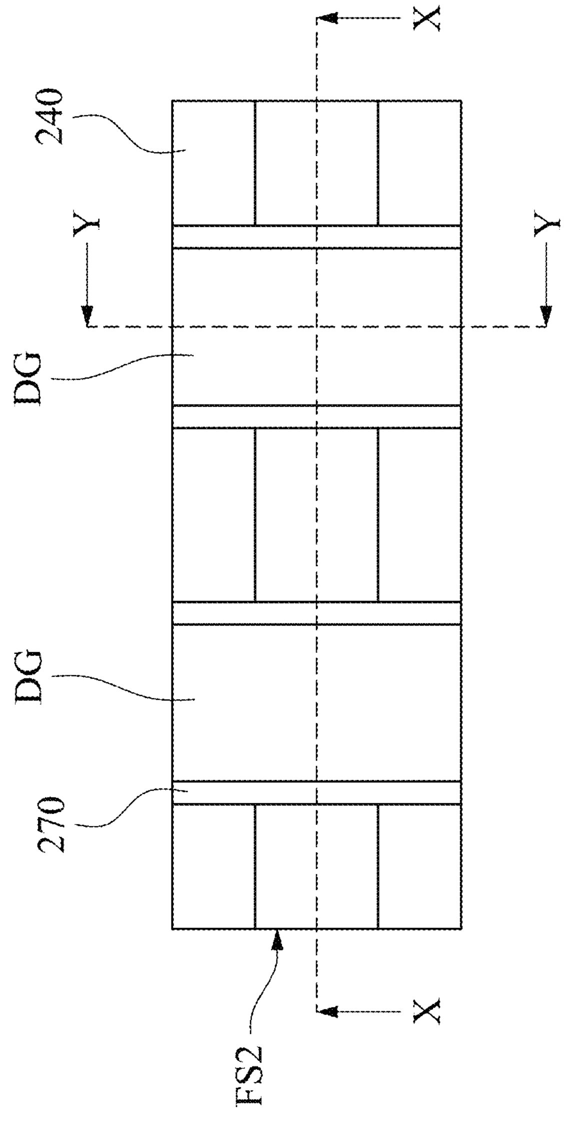
Figure 8B:
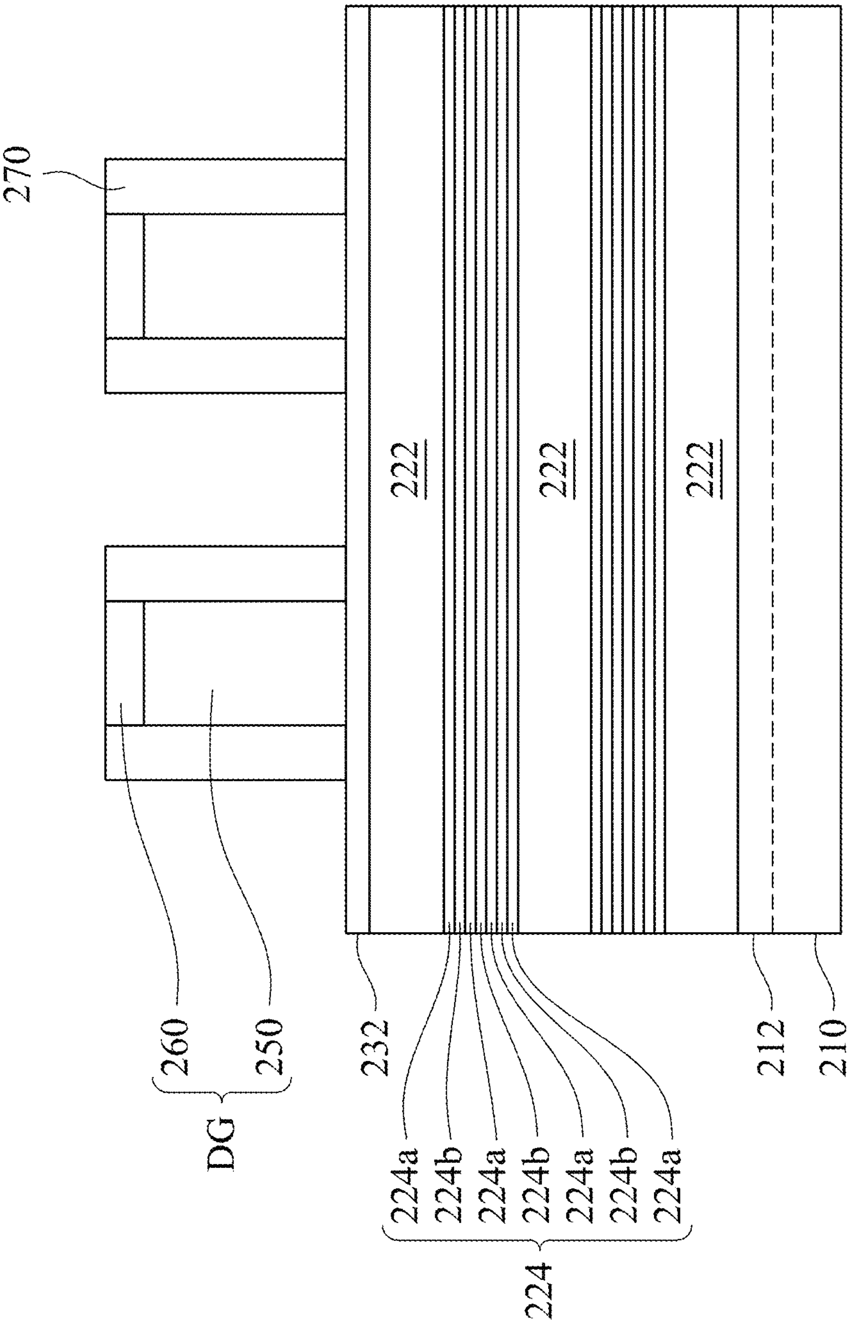
Figure 8C:
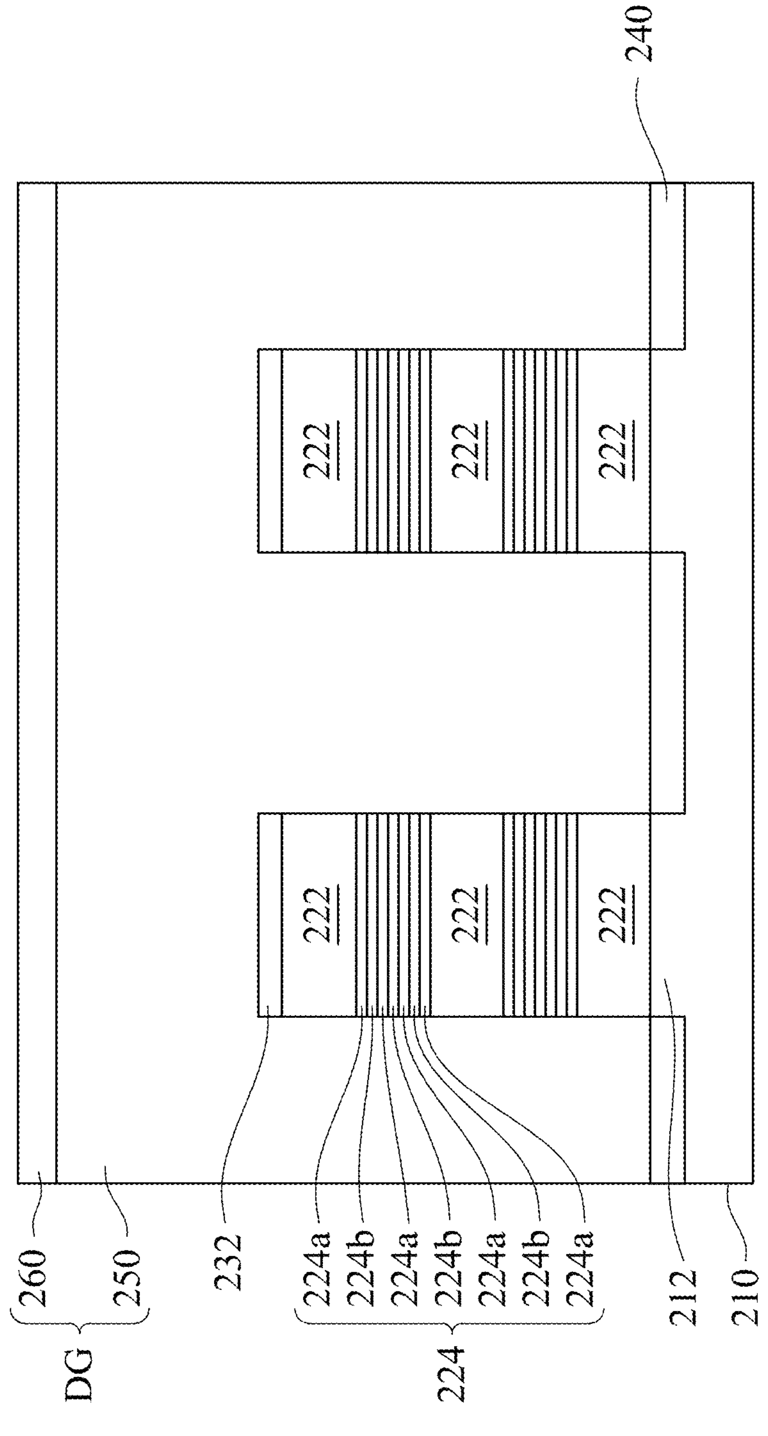

Reference is made to FIGS. 8A-8C. Gate structures DG are formed. In some embodiments, the gate structures DG are dummy (sacrificial) gate structures that are subsequently removed. Thus, in some embodiments using a gate-last process, the gate structures DG are dummy gate structures and will be replaced by the final gate structures at a subsequent processing stage of the semiconductor device. In particular, the dummy gate structures DG may be replaced at a later processing stage by a high-k dielectric layer (HK) and metal gate electrode (MG) as discussed below. In some embodiments, the dummy gate structures DG are formed over the substrate 210 and are at least partially disposed over the fins FS2. The portion of the fins FS2 underlying the dummy gate structures DG may be referred to as the channel region. The dummy gate structures DG may also define a source/drain (S/D) region of the fins FS2, for example, the regions of the fin FS2 adjacent and on opposing sides of the channel region.

A dummy gate layer is formed on the fin FS2. The dummy gate layer which will form a dummy gate 250 including a dummy gate dielectric layer and a dummy gate electrode layer over the dummy gate dielectric layer. The dummy gate dielectric layer may be formed of a dielectric material such as silicon oxide, silicon nitride, a combination thereof, or the like, which may be deposited or thermally grown according to acceptable techniques. The dummy gate electrode layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like.

A hard mask layer 260 is formed on the dummy gate layer and patterned by suitable lithography and etching processes. In some embodiments, the hard mask layer 260 may be formed of a dielectric material such as silicon nitride, silicon oxynitride, silicon oxycarbide (SiOC), silicon oxycarbonitride (SiOCN), the like, or a combination thereof. In the lithography process (e.g., photolithography or e-beam lithography) may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. Subsequently, a pattern of the patterned hard mask layer 260 formed on the dummy gate layer is transferred to the dummy gate layer by any acceptable etching technique, thereby patterning the dummy gate layer into the dummy gate 250. In some embodiments, the etching process may include dry etching (e.g., RIE etching), wet etching, and/or other etching methods. After the patterning process, the dummy gate 250 covers portions of the fins FS2, which will be exposed in subsequent processing to form channel regions. The dummy gate 250 may also have a lengthwise direction substantially perpendicular (within process variations) to a lengthwise direction of the fin FS2.

After the formation of the dummy gate structures DG, gate spacers 270 are formed on sidewalls of the dummy gate structures DG. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 270. For example, an anisotropic etching process is performed on the deposited spacer material layer to expose portions of the fins FS2 not covered by the dummy gate structures DG (e.g., in source/drain regions of the fins FS2). Portions of the spacer material layer directly above the dummy gate structures DG may be completely removed by this anisotropic etching process. In some embodiments, the spacer material layer includes multiple layers, and therefore the gate spacers 270 may be multi-layer structures.

Figure 9:
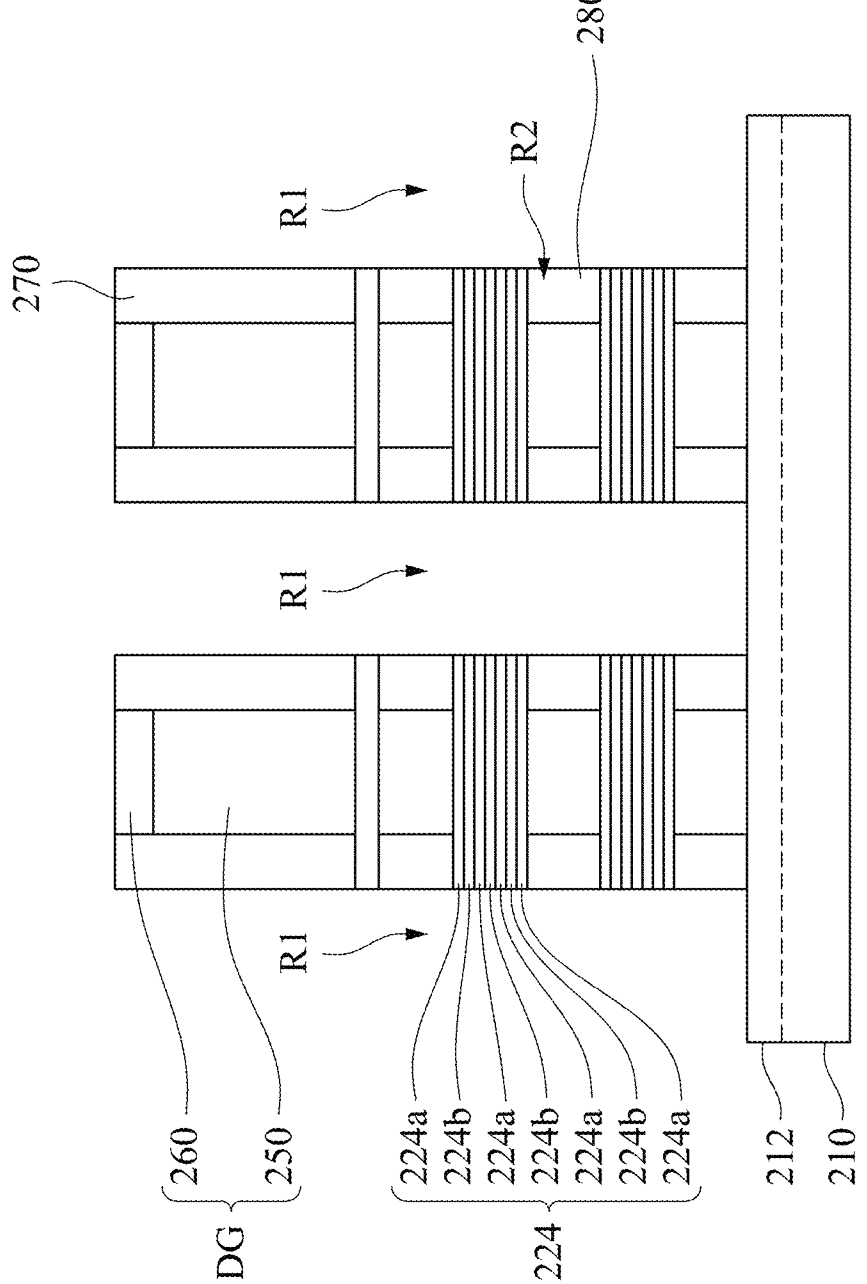

Reference is made to FIG. 9. Exposed portions of the semiconductor fins FS2 that extend laterally beyond the gate spacers 270 (e.g., in source/drain regions of the fins FS2) are etched by using, for example, an anisotropic etching process that uses the dummy gate structure DG and the gate spacers 270 as an etch mask, resulting in recesses R1 into the semiconductor fins FS2 and between corresponding dummy gate structures DG. The recesses R1 may extend through the epitaxial layers 222 and the channel layers 224*a* and 224*b*. After the anisotropic etching, end surfaces of the sacrificial layers 222 and end surfaces of channel layers 224*a* and 224*b* are exposed and aligned with respective outermost sidewalls of the gate spacers 270, due to the anisotropic etching. In some embodiments, the anisotropic etching may be performed by a dry chemical etch (e.g., reactive-ion etching) with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The sacrificial layers 222 are laterally or horizontally recessed by using suitable selective etching process, resulting in lateral/sidewall recesses R2 each vertically between corresponding channel layers 224. The lateral/sidewall recesses R2 may alternate with the channel layers 224. For example, end surfaces of the sacrificial layers 222 are recessed by the selective etching process. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 224*a* and 224*b* may have a higher etch resistance to the etching process than that of the epitaxial layers 222. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 224*a* and 224*b* may not be not significantly etched by the process of laterally recessing the sacrificial layers 222. As a result, the channel layers 224*a* and 224*b* laterally extend past opposite end surfaces of the sacrificial layers 222.

Inner spacers 280 are formed in the recesses R2. Stated differently, the inner spacers 280 may be formed on opposite end surfaces of the laterally recessed sacrificial layers 222. The inner spacers 280 may include a low-k dielectric material, such as $SiO_x$, SiON, SiOC, SiN, SiCN, or SiOCN. Formation of the inner spacers 280 may include depositing an inner spacer material layer, followed by an anisotropic etching process to trim the deposited inner spacer material layer. Through the anisotropic etching process, only portions of the deposited inner spacer material layer that fill the lateral/sidewall recesses R2 left by the lateral etching of the sacrificial layers 222 are left. The inner spacer 280 may include a single layer or multiple layers. The inner spacers 280 may serve to isolate metal gates from source/drain regions formed in subsequent processing. In the example of FIG. 9, sidewalls of the inner spacers 280 are aligned with sidewalls of the channel layers 224.

Figure 10:
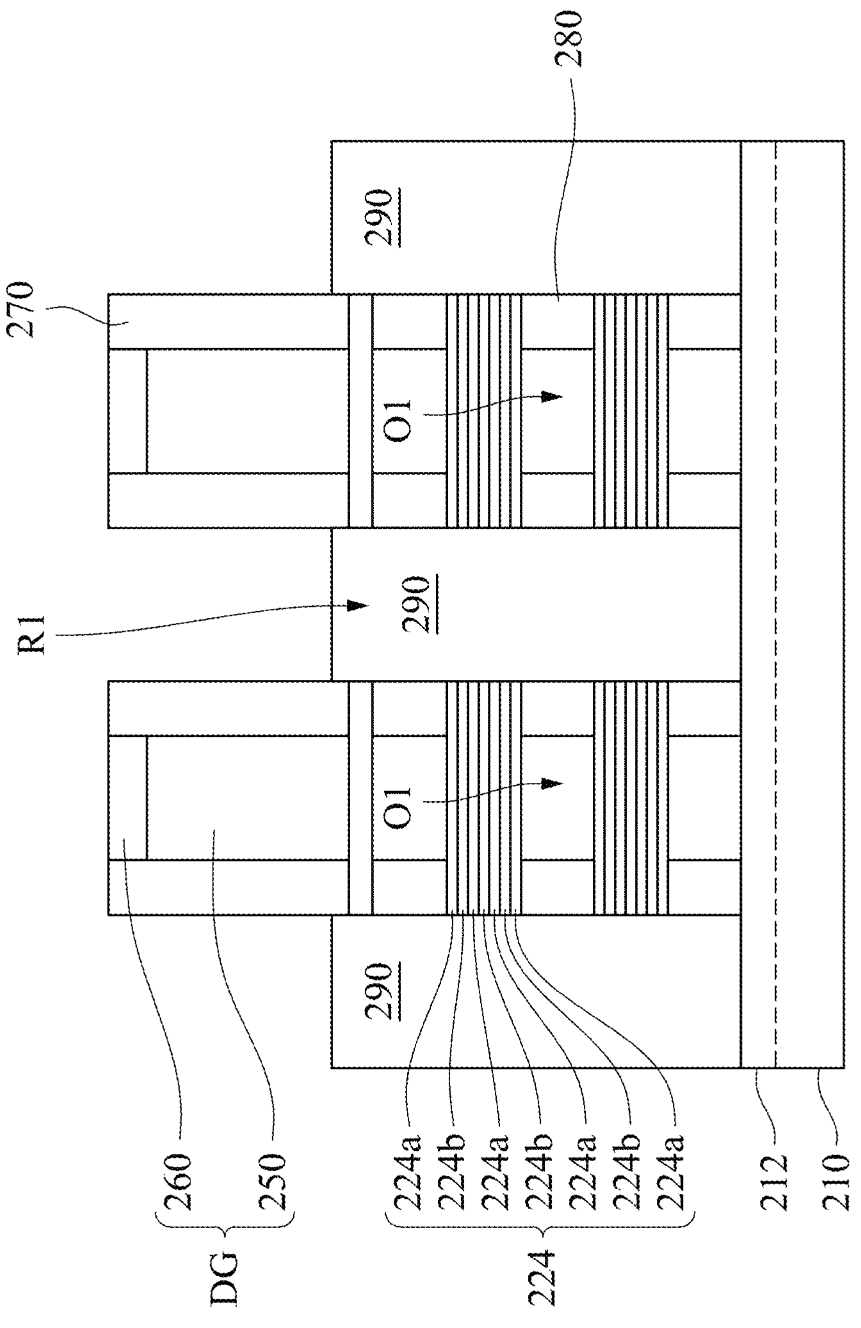

Reference is made to FIG. 10. Source/drain epitaxial structures 290 are formed in the recesses R1 on opposite sides of the channel layers 224 and on opposite sides of the dummy gate structure DG. The source/drain epitaxial structures 290 are in contact with the exposed end surfaces of channel layers 224*a* and 224*b*. In some embodiments, the source/drain epitaxial structures 290 may include Ge, Si, GaAs, AlGaAs, SiGe, GaAsP, SiP, or other suitable material. The source/drain epitaxial structures 290 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 290 are not in-situ doped, an implantation process (i.e., a junction implant process) is performed to dope the source/drain epitaxial structures 290. The source/drain epitaxial structures 290 may be formed by performing an epitaxial growth process that provides an epitaxial material on the exposed surfaces of the fins FS2. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate portion 212 and the channel layers 224 of the fins FS2. In some embodiments, the source/drain epitaxial structures 290 may also be referred to as source/drain regions.

Reference is made to FIG. 11. A dielectric material 300 is formed over the substrate 210 and filling the space between the dummy gate structures DG. In some embodiments, the dielectric material 300 includes a contact etch stop layer (CESL) and an interlayer dielectric (ILD) layer formed in sequence. In some examples, the CESL includes a silicon nitride layer, silicon oxide layer, a silicon oxynitride layer, and/or other suitable materials having a different etch selectivity than the ILD layer. The CESL may be formed by plasma-enhanced chemical vapor deposition (PECVD) process and/or other suitable deposition or oxidation processes. The ILD layer is then deposited over the CESL. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer may be deposited by a PECVD process or other suitable deposition technique. In some embodiments, after formation of the ILD layer, the semiconductor device may be subject to a high thermal budget process to anneal the ILD layer. After depositing the ILD layer, a planarization process may be performed to remove excessive materials of the ILD layer. For example, a planarization process includes a chemical mechanical planarization (CMP) process which removes portions of the ILD layer and the CESL layer overlying the dummy gate structures DG and planarizes a top surface of the semiconductor device.

FIGS. 12A-13C shows a gate replacement process. The dummy gate structure DG and the sacrificial layer 222 are replaced with a high-k/metal gate structure GS. Reference is made to FIGS. 12A-12C. The dummy gate structures DG (referring to FIG. 11) are removed, followed by removing the sacrificial layers 222 (referring to FIG. 11). In the illustrated embodiments, the dummy gate structures DG (referring to FIG. 11) are removed by using a selective etching process (e.g., selective dry etching, selective wet etching, or a combination thereof) that etches the materials in dummy gate structures DG (referring to FIG. 11) at a faster etch rate than it etches other materials (e.g., gate spacers 270 and/or the dielectric material 300), thus resulting in gate trenches GT between corresponding gate spacers 270, with the sacrificial layers 222 (referring to FIG. 11) exposed in the gate trenches GT. Subsequently, the sacrificial layers 222 (referring to FIG. 11) in the gate trenches GT are etched by using another selective etching process that etches the sacrificial layers 222 at a faster etch rate than it etches the channel layers 224 including the layers 224*a* and 224*b*, thus forming openings/spaces O1 between neighboring channel layers 224. The openings/spaces O1 may expose the sidewalls of the inner spacers 280. In this way, the channel layers 224 become nanosheets suspended over the substrate 210 and between the source/drain epitaxial structures 290. This step is also called a channel release process. At this interim processing step, the openings/spaces O1 between nanosheets 224 may be filled with ambient environment conditions (e.g., air, nitrogen, etc). In some embodiments, the nanosheets 224 can be interchangeably referred to as nanowires, nanoslabs and nanorings, depending on their geometry. For example, in some other embodiments the channel layers 224 may be trimmed to have a substantial rounded shape (i.e., cylindrical) due to the selective etching process for completely removing the sacrificial layers 222 (referring to FIG. 11). In that case, the resultant channel layers 224 can be called nanowires.

In some embodiments, the sacrificial layers 222 (referring to FIG. 11) are removed by using a selective dry etching process. In some embodiments, the sacrificial layers 222 (referring to FIG. 11) are SiGe and the channel layers 224 are silicon allowing for the selective removal of the sacrificial layers 222 (referring to FIG. 11). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layer 222 is removed. Moreover, because oxidation rate of Si is much lower (sometimes 30 times lower) than oxidation rate of SiGe, the channel layers 224 including the layers 224*a* and 224*b* may remain substantially intact during the channel release process.

Reference is made to FIGS. 13A-13C. Replacement gate structures GS are respectively formed in the gate trenches GT to surround each of the nanosheets 224 suspended in the gate trenches GT. The gate structures GS may be final gates of GAA FETs. The final gate structure may be a high-k/metal gate stack, however other compositions are possible. In some embodiments, each of the gate structures GS forms the gate associated with the multi-channels provided by the plurality of nanosheets 224. For example, the high-k/metal gate structures GS are formed within the openings/spaces O1 provided by the release of nanosheets 224. The high-k/metal gate structures GS may be between the nanosheets 224 and surrounded by the inner spacers 280.

In various embodiments, the high-k/metal gate structure GS includes a gate dielectric layer 310 formed around the nanosheets 224 and a gate metal layer 320 formed around the dielectric layer 310 and filling a remainder of gate trenches GT. Formation of the high-k/metal gate structures GS may include one or more deposition processes to form various gate materials, followed by a CMP processes to remove excessive gate materials, resulting in the high-k/metal gate structures GS having top surfaces level with a top surface of the dielectric material 300. Thus, transistors (e.g., GAA FET) are formed, and the high-k/metal gate structure GS surrounds each of the nanosheets 224, and thus is referred to as a gate of the transistors (e.g., GAA FET).

The gate dielectric layer 310 may include an interfacial layer 310*a* and a high-k gate dielectric layer 310*b* over the interfacial layer 310*a*. In some embodiments, the interfacial layer 310*a* is silicon oxide formed on exposed surfaces of semiconductor materials in the gate trenches GT by using, for example, thermal oxidation, chemical oxidation, wet oxidation or the like. As a result, surface portions of the nanosheets 224 (e.g., the top and bottommost channel layers, such as the channel layers 224*a*, in each multi-layer channel film 224) and the substrate 210 exposed in the gate trenches GT are oxidized into silicon oxide to form interfacial layer 310*a*. In some embodiments, the high-k gate dielectric layer 310*b* includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO; HZO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 320 includes one or more metal layers. For example, the gate metal layer 320 may include one or more work function metal layers stacked one over another and a fill metal filling up a remainder of gate trenches GT. The one or more work function metal layers in the gate metal layer 320 provide a suitable work function for the high-k/metal gate structures GS. For an n-type GAA FET, the gate metal layer 320 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. On the other hand, for a p-type GAA FET, the gate metal layer 320 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 320 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 14:
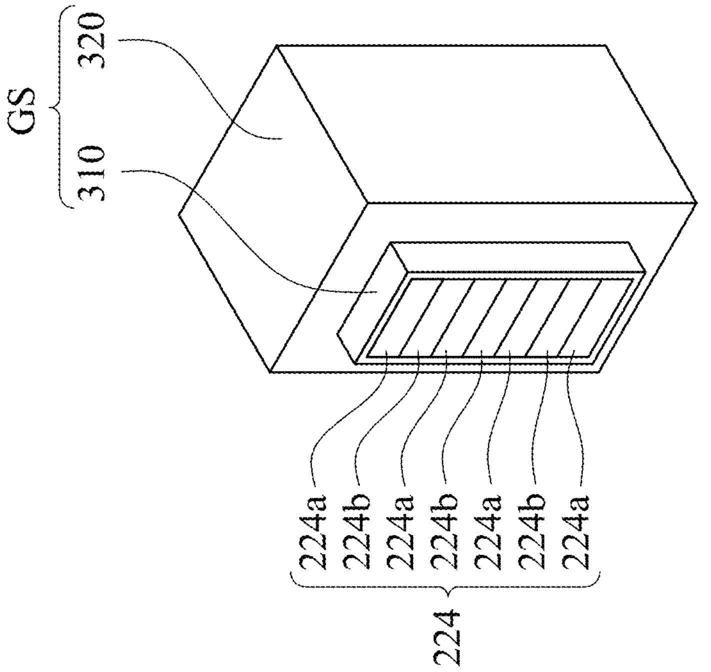
FIG. 14 is a schematic view of GAA transistors in accordance with some embodiments of the present disclosure.

FIG. 14 is a schematic view of GAA transistors in accordance with some embodiments of the present disclosure. As the embodiments of FIG. 6-13C, the topmost epitaxial layer of the multi-layer channel film 224 is the channel layer 224*a* (e.g., Si layer). The gate dielectric layer 310 may extend along sidewalls of the channel layers 224*a* and 224*b* and in contact with a top surface of the topmost channel layer 224*a* and a bottom surface of the bottommost channel layer 224*a*. By using the Si layer capping the channel layer, defects resulting from germanium thermal oxidation can be reduced. Other details of the present embodiments are similar to that of the embodiments of FIGS. 6-13C, and thereto not repeated herein.

Figure 15:
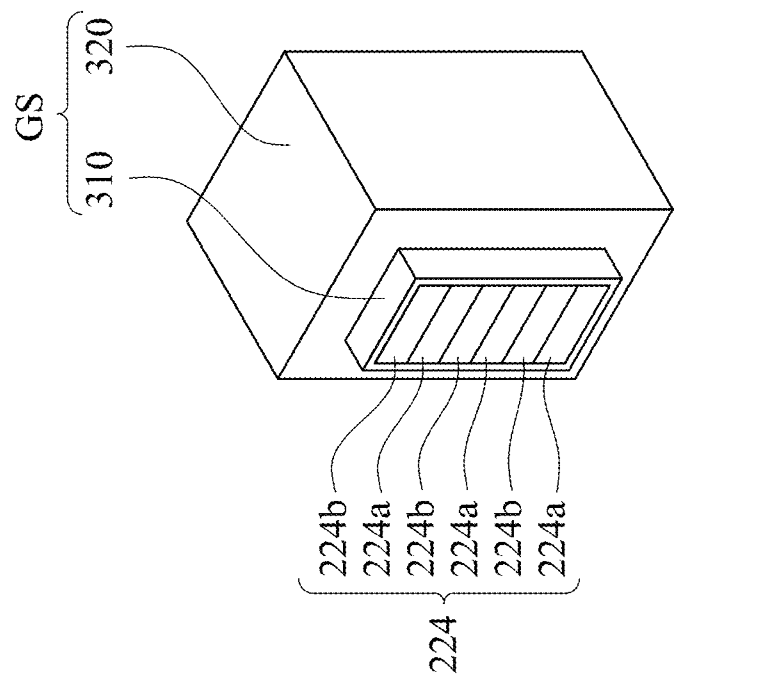
FIG. 15 is a schematic view of GAA transistors in accordance with some embodiments of the present disclosure.

FIG. 15 is a schematic view of GAA transistors in accordance with some embodiments of the present disclosure. Details of the present embodiments are similar to that of the embodiments of FIGS. 6-13C and FIG. 14, except that the topmost epitaxial layer of the multi-layer channel film 224 is the channel layer 224*b* (e.g., SiGe layer). The gate dielectric layer 310 may extend along sidewalls of the channel layers 224*a* and 224*b* and in contact with a top surface of the topmost channel layer 224*b* and a bottom surface of the bottommost channel layer 224*a*. Other details of the present embodiments are similar to that of the embodiments of FIGS. 6-13C and FIG. 14, and thereto not repeated herein.

Figure 16B:
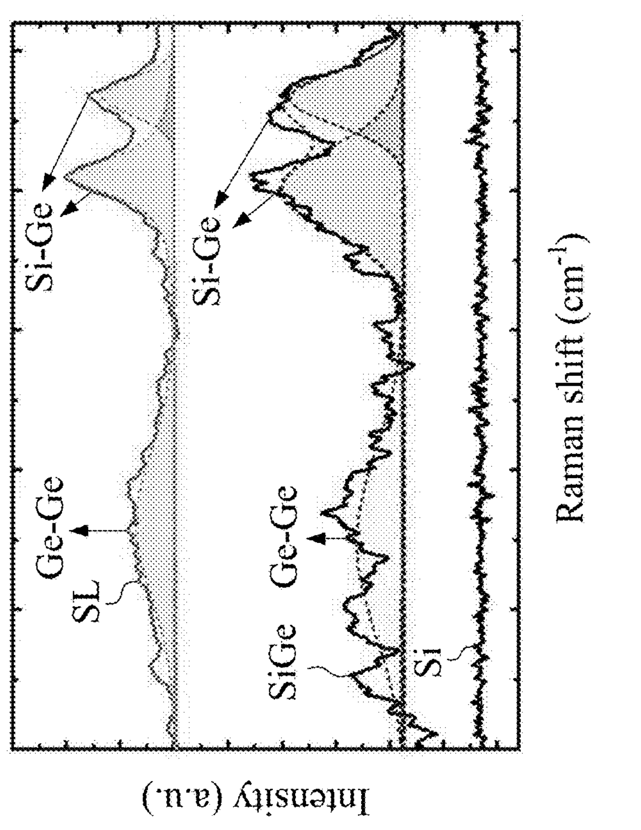
FIGS. 16A and 16B are Raman spectra of various channel materials in accordance with some embodiments of the present disclosure.
Figure 16A:
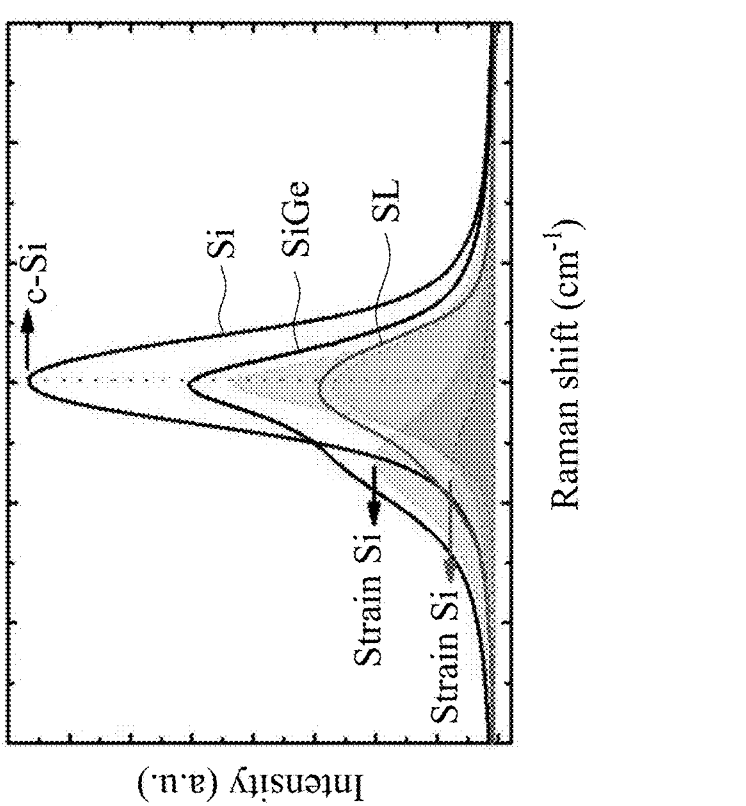
Figure 16D:
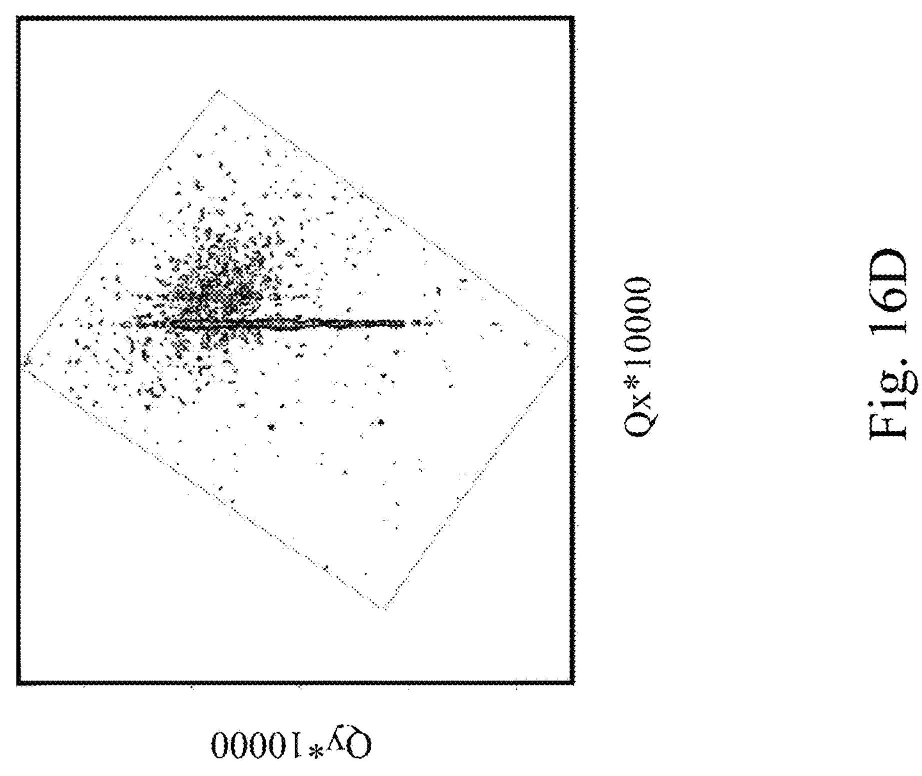
FIGS. 16C and 16D are X-ray Diffraction (XRD) reciprocal space mappings of superlattice (SL) sample respectively at (004) and (224) plane.
Figure 16C:
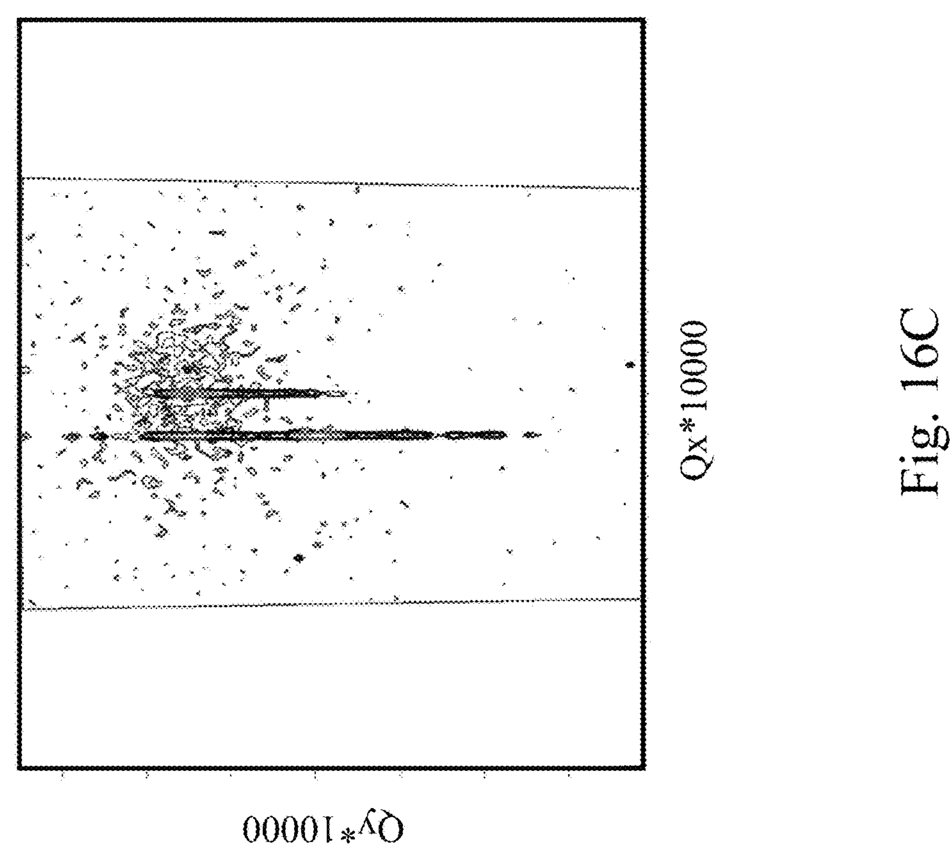
Figure 16E:
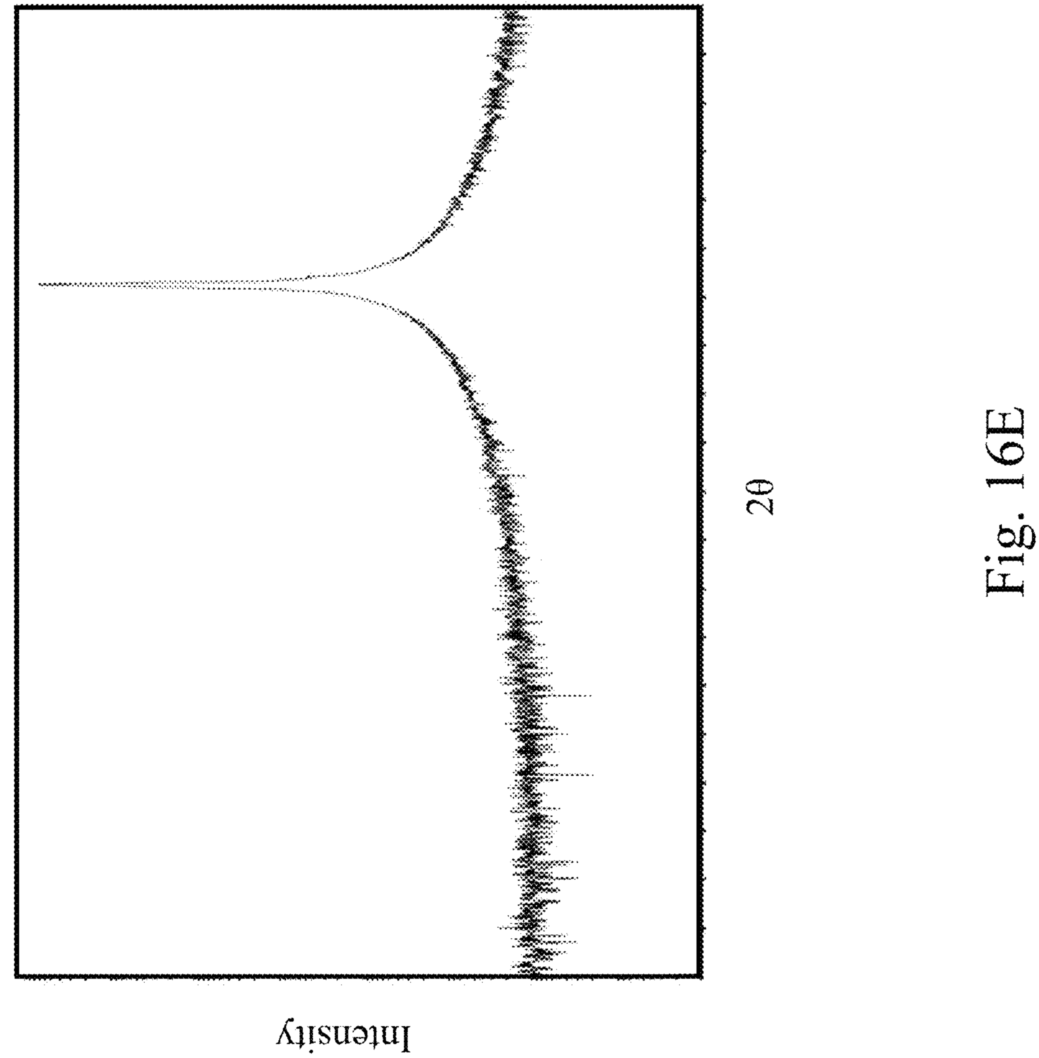
FIG. 16E is a graph of theta versus intensity of SL sample from the XRD measurement.

FIGS. 16A and 16B are Raman spectra of various channel materials in accordance with some embodiments of the present disclosure. For example, Raman spectra of Si material, SiGe material (e.g., $Si_{0.8}Ge_{0.2}$), and SiGe/Si super-lattice (SL) are indicated as Si sample, SiGe sample, and SL sample. Raman spectra can be used to analyzed the strain effect in channels. Both the Ge—Ge and the Si—Ge vibration mode of SL sample shift to higher wavenumber compare to the SiGe sample indicating the SiGe layers in SL sample are compressively strained. FIGS. 16C and 16D are X-ray Diffraction (XRD) reciprocal space mapping (RSM) patterns of superlattice (SL) sample respectively at (004) and (224) plane. FIG. 16E is a graph of theta versus intensity of SL sample from the XRD measurement. The results show that the x-ray reflection arising from SiGe and Si appear at the same in-plane wavevector, revealing that they have the same in-plane lattice constant. This means that the SiGe in the SiGe/Si super-lattice is fully compressively strained.

Figures 17A, 17B, 17C, 18A, 18B, 18C:
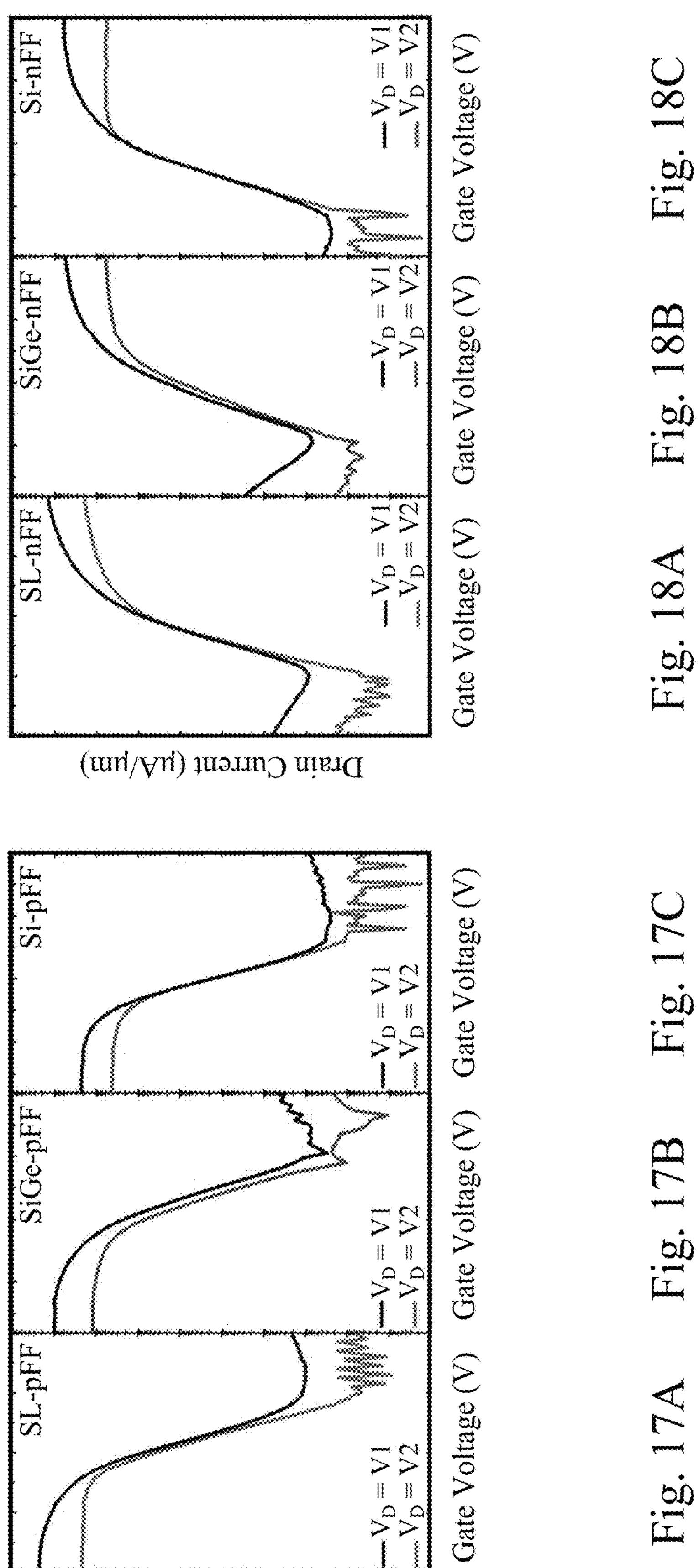
FIGS. 17A-17C are respectively graphs of drain current versus gate voltage of p-type transistors with different channel materials in accordance with some embodiments of the present disclosure.
FIGS. 18A-18C are respectively graphs of drain current versus gate voltage of n-type transistors with different channel materials in accordance with some embodiments of the present disclosure.

FIGS. 17A-17C are respectively graphs of drain current versus gate voltage of p-type transistors with different channel materials in accordance with some embodiments of the present disclosure. For example, p-type transistors with SiGe/Si super-lattice channel, SiGe channel (e.g., $Si_{0.8}Ge_{0.2}$), and Si channel are respectively indicated as SL-pFF sample, SiGe-pFF sample, and Si-pFF sample respectively in FIGS. 17A-17C. It is evidenced from FIGS. 17A-17C that SL-pFF sample have lower subthreshold swing (SS) than SiGe-pFF sample and Si-pFF sample. And, SL-pFF sample have a suitable drain-induced barrier lowering (DIBL) between DIBLs of SiGe-pFF sample and Si-pFF sample. Due to the strain effect, the SL-pFF sample has the highest $I_{on}$ and reflect on the high $I_{on}/I_{off}$ and exhibits the symmetrical drain saturation current.

FIGS. 18A-18C are respectively graphs of drain current versus gate voltage of n-type transistors with different channel materials in accordance with some embodiments of the present disclosure. For example, n-type transistors with SiGe/Si super-lattice channel, SiGe channel (e.g., $Si_{0.8}Ge_{0.2}$), and Si channel are respectively indicated as SL-nFF sample, SiGe-nFF sample, and Si-nFF sample respectively in FIGS. 18A-18C. It is evidenced from FIGS. 18A-18C that SL-nFF sample have lower SS than SiGe-nFF sample and Si-nFF sample. And, SL-nFF sample have a suitable DIBL between DIBLs of SiGe-nFF sample and Si-nFF sample. Due to the strain effect, the SL-nFF sample has the highest $I_{on}$ and reflect on the high $I_{on}/I_{off}$ and exhibits the symmetrical drain saturation current. From FIGS. 17A-17C and FIGS. 18A-18C, for both n-type transistors and p-type transistors, using a SiGe/Si super-lattice channel is beneficial for obtaining low SS, high $I_{on}$ and high $I_{on}/I_{off}$. In FIGS. 17A-18C, the drain voltage is set at first voltage level V1 and second voltage level V2, in which the first voltage level V1 is greater than the second voltage level V2. For example, the first voltage level V1 is in a range from about 0.4 V to about 0.6V, and the second voltage level V2 is in a range from about 0.04 V to about 0.06V.

Figures 19A, 19B, 20A, 20B:
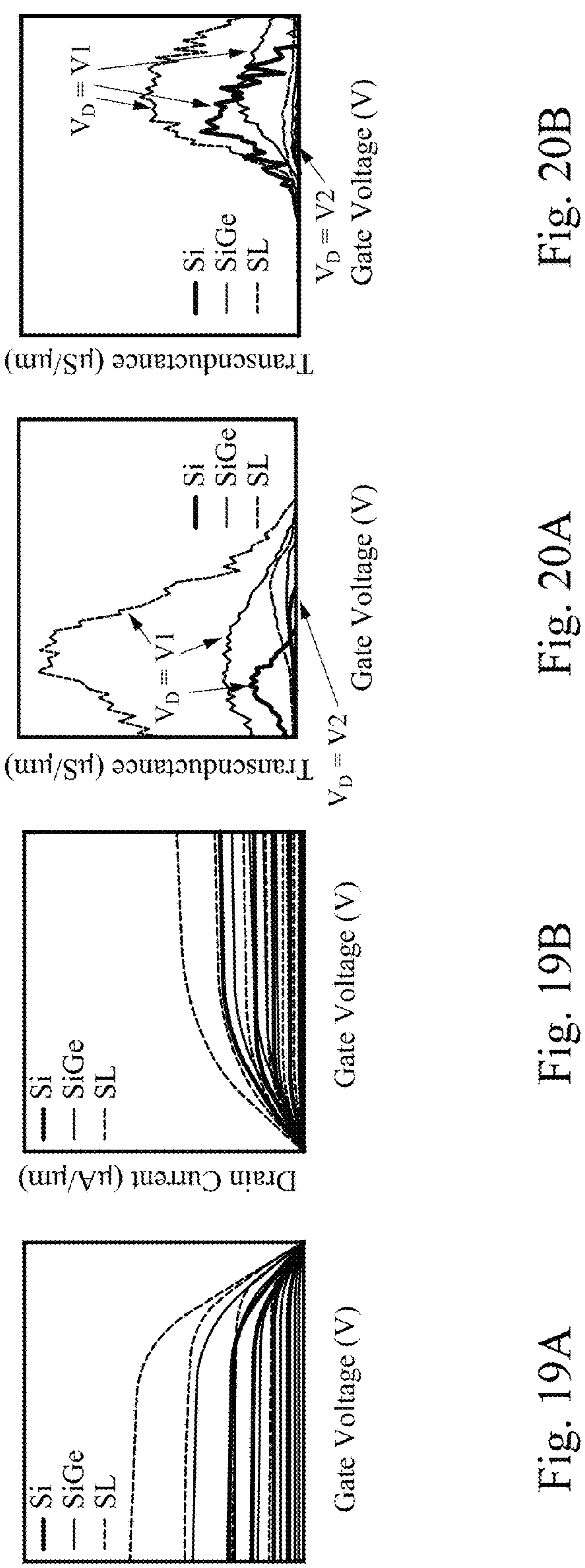
FIG. 19A is a graph of drain current versus drain voltage of p-type transistors with different channel materials in accordance with some embodiments of the present disclosure.
FIG. 19B is a graph of drain current versus drain voltage of n-type transistors with different channel materials in accordance with some embodiments of the present disclosure.
FIG. 20A is a graph of transconductance versus gate voltage of p-type transistors with different channel materials in accordance with some embodiments of the present disclosure.
FIG. 20B is a graph of transconductance versus gate voltage of n-type transistors with different channel materials in accordance with some embodiments of the present disclosure.

FIG. 19A is a graph of drain current versus drain voltage of p-type transistors with different channel materials in accordance with some embodiments of the present disclosure. FIG. 19B is a graph of drain current versus drain voltage of n-type transistors with different channel materials in accordance with some embodiments of the present disclosure. For example, transistors with SiGe/Si super-lattice channel, SiGe channel (e.g., $Si_{0.8}Ge_{0.2}$), and Si channel are respectively indicated as SL sample, SiGe sample, and Si sample respectively in FIGS. 19A and 19B. From FIG. 19A and FIG. 19B, when drain voltage is set at the first voltage level V1, for both n-type transistors and p-type transistors, the drive currents of SL samples improves comparing to the SiGe samples and Si samples, respectively.

FIG. 20A is a graph of transconductance versus gate voltage of p-type transistors with different channel materials in accordance with some embodiments of the present disclosure. FIG. 20B is a graph of transconductance versus gate voltage of n-type transistors with different channel materials in accordance with some embodiments of the present disclosure. For example, transistors with SiGe/Si super-lattice channel, SiGe channel (e.g., $Si_{0.8}Ge_{0.2}$), and Si channel are respectively indicated as SL sample, SiGe sample, and Si sample respectively in FIGS. 20A and 20B. For both n-type transistors and p-type transistors, SL samples present the highest maximum transconductance when drain voltage is set at the first voltage level V1.

FIG. 21A is a statistic three-dimensional (3D) contour plot of $SS_{LIN}$ versus gate length ($L_g$) and channel width ($W_{ch}$) of p-type transistors with different channel materials in accordance with some embodiments of the present disclosure. FIG. 21B is a statistic 3D contour plot of $SS_{LIN}$ versus $L_g$ and $W_{ch}$ of n-type transistors with different channel materials in accordance with some embodiments of the present disclosure. FIG. 22A is a statistic 3D contour plot of $I_{ON}/I_{OFF}$ ratio versus $L_g$ and $W_{ch}$ of p-type transistors with different channel materials in accordance with some embodiments of the present disclosure. FIG. 22B is a statistic 3D contour plot of ION/OFF ratio versus $L_g$ and $W_{ch}$ of n-type transistors with different channel materials in accordance with some embodiments of the present disclosure. For example, transistors with SiGe/Si super-lattice channel, SiGe channel (e.g., $Si_{0.8}Ge_{0.2}$), and Si channel are respectively indicated as SL sample, SiGe sample, and Si sample in FIGS. 21A-22B. The statistic 3D contour plots of $SS_{LIN}$ and $I_{ON}/I_{OFF}$ with $L_g$ from 200 nm to 500 nm and $W_{ch}$ from 30 nm to 40 nm show that the SL sample exhibit the lowest $SS_{LIN}$ and the highest $I_{ON}/I_{OFF}$ for both n- and p-FinFETs.

Figure 24B:
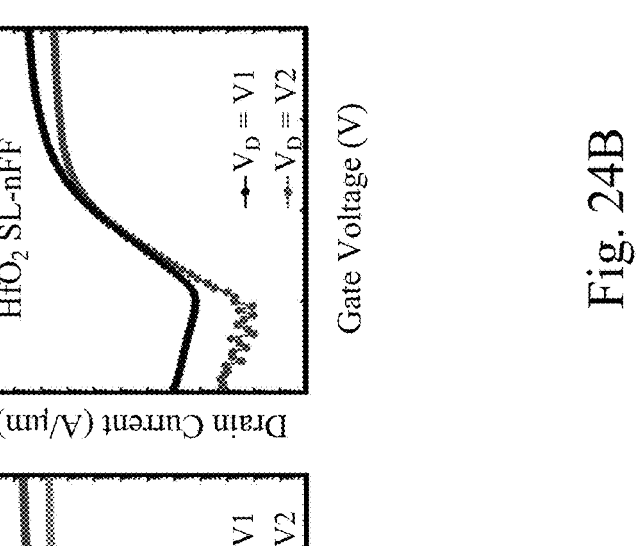
FIG. 24B is a graph of drain current versus gate voltage of n-type transistors having a superlattice channel with a $HfO_2$ gate dielectric layer in accordance with some embodiments of the present disclosure.
Figure 24A:
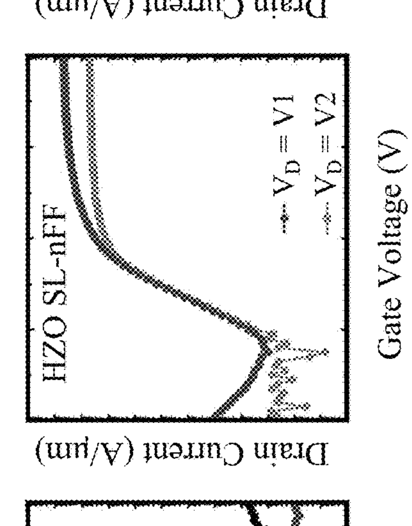
FIG. 24A is a graph of drain current versus gate voltage of n-type transistors having a superlattice channel with a HZO gate dielectric layer in accordance with some embodiments of the present disclosure.
Figure 24A:
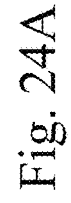
Figure 24A:
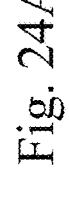
Figure 24A:
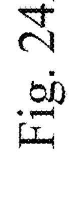
Figure 23B:
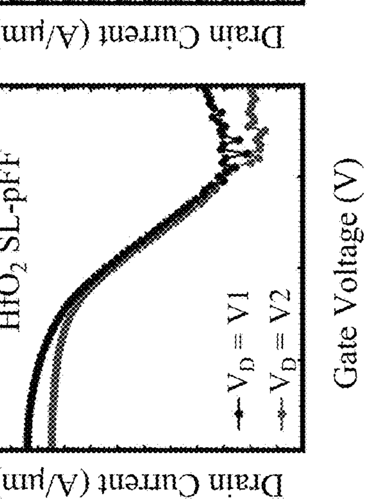
FIG. 23B is a graph of drain current versus gate voltage of p-type transistor having a superlattice channel with a $HfO_2$ gate dielectric layer in accordance with some embodiments of the present disclosure.
Figure 23B:
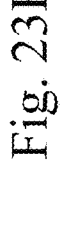
Figure 23A:
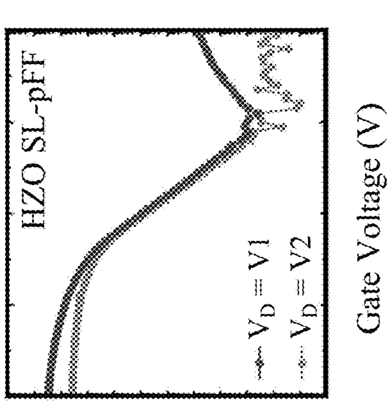
FIG. 23A is a graph of drain current versus gate voltage of p-type transistor having a superlattice channel with a HZO gate dielectric layer in accordance with some embodiments of the present disclosure.

FIG. 23A is a graph of drain current versus gate voltage of p-type transistor having a superlattice channel with a HZO gate dielectric layer in accordance with some embodiments of the present disclosure. FIG. 23B is a graph of drain current versus gate voltage of p-type transistor having a superlattice channel with a $HfO_2$ gate dielectric layer in accordance with some embodiments of the present disclosure. FIG. 24A is a graph of drain current versus gate voltage of n-type transistors having a superlattice channel with a HZO gate dielectric layer in accordance with some embodiments of the present disclosure. FIG. 24B is a graph of drain current versus gate voltage of n-type transistors having a superlattice channel with a $HfO_2$ gate dielectric layer in accordance with some embodiments of the present disclosure. The p-type transistor having SiGe/Si super-lattice channel with a HZO layer is indicated as HZO SL-pFF sample. The p-type transistor having SiGe/Si super-lattice channel with a $HfO_2$ layer is indicated as $HfO_2$ SL-pFF sample. The n-type transistor having SiGe/Si super-lattice channel with a $H_2O$ layer is indicated as HZO SL-nFF sample. The n-type transistor having SiGe/Si super-lattice channel with a $HfO_2$ layer is indicated as $HfO_2$ SL-nFF sample.

Compared with $HfO_2$ SL-pFF sample, the HZO SL-pFF sample has lower SS and DIBL. Compared with $HfO_2$ SL-nFF sample, the HZO SL-nFF sample has lower SS and DIBL. The results reveal that the HZO SL-nFF samples exhibit outstanding subthreshold characteristic and have suppression on short channel effect in small dimension, which is due to the surface potential amplification resulting from the negative capacitance effect of ferroelectric HZO.

Figures 25A, 25B, 26A, 26B:
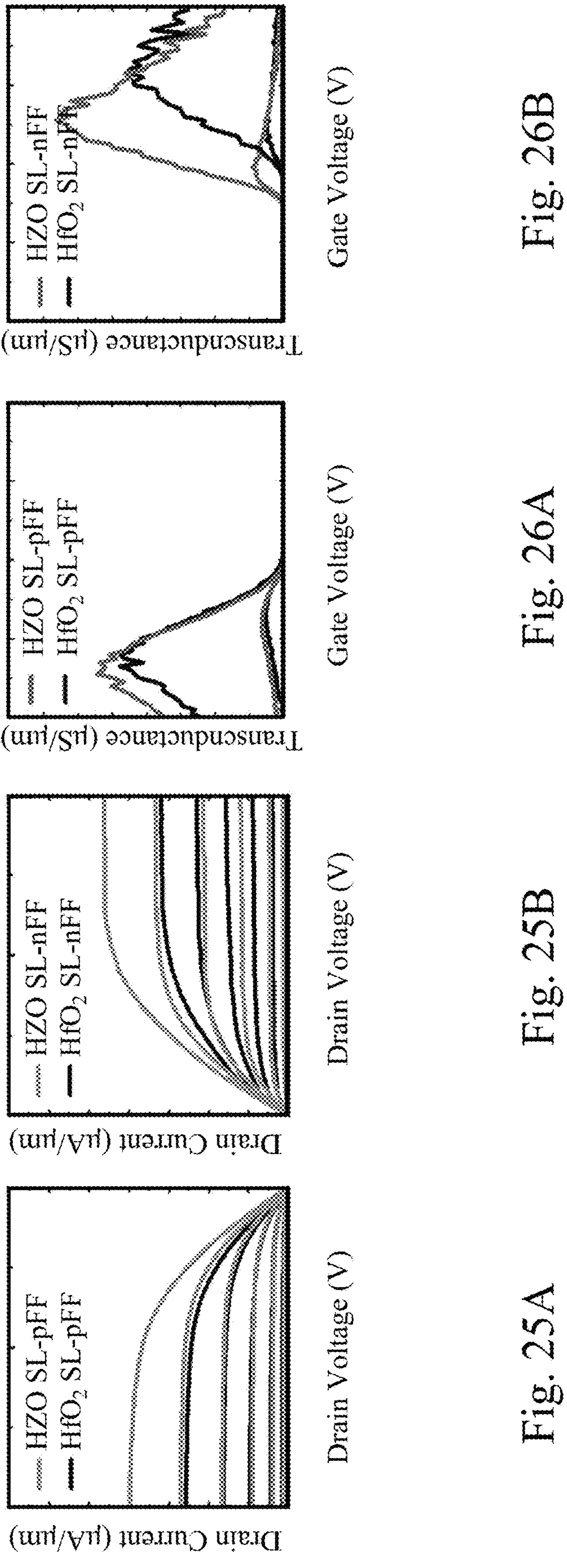
FIG. 25A is a graph of drain current versus drain voltage of p-type transistors having a superlattice channel with different gate dielectric layers in accordance with some embodiments of the present disclosure.
FIG. 25B is a graph of drain current versus drain voltage of n-type transistors having a superlattice channel with different gate dielectric layers in accordance with some embodiments of the present disclosure.
FIG. 26A is a graph of transconductance versus gate voltage of p-type transistors having a superlattice channel with different gate dielectric layers in accordance with some embodiments of the present disclosure.
FIG. 26B is a graph of transconductance versus gate voltage of n-type transistors having a superlattice channel with different gate dielectric layers in accordance with some embodiments of the present disclosure.

FIG. 25A is a graph of drain current versus drain voltage of p-type transistors having a superlattice channel with different gate dielectric layers in accordance with some embodiments of the present disclosure. FIG. 25B is a graph of drain current versus drain voltage of n-type transistors having a superlattice channel with different gate dielectric layers in accordance with some embodiments of the present disclosure.

The p-type transistor having SiGe/Si super-lattice channel with a HZO layer is indicated as HZO SL-pFF sample. The p-type transistor having SiGe/Si super-lattice channel with a $HfO_2$ layer is indicated as $HfO_2$ SL-pFF sample. The n-type transistor having SiGe/Si super-lattice channel with a HZO layer is indicated as HZO SL-nFF sample. The n-type transistor having SiGe/Si super-lattice channel with a $HfO_2$ layer is indicated as $HfO_2$ SL-nFF sample. The drive current of HZO SL-pFF sample is greater than that of the $HfO_2$ SL-pFF sample. The drive current of HZO SL-nFF sample is greater than that of the $HfO_2$ SL-nFF sample.

FIG. 26A is a graph of transconductance versus gate voltage of p-type transistors having a superlattice channel with different gate dielectric layers in accordance with some embodiments of the present disclosure. FIG. 26B is a graph of transconductance versus gate voltage of n-type transistors having a superlattice channel with different gate dielectric layers in accordance with some embodiments of the present disclosure. While HZO has higher k value, the HZO SL-pFF sample and the HZO SL-nFF sample show higher transconductance than that of the $HfO_2$ SL-pFF sample and the $HfO_2$ SL-nFF sample.

Figure 27B:
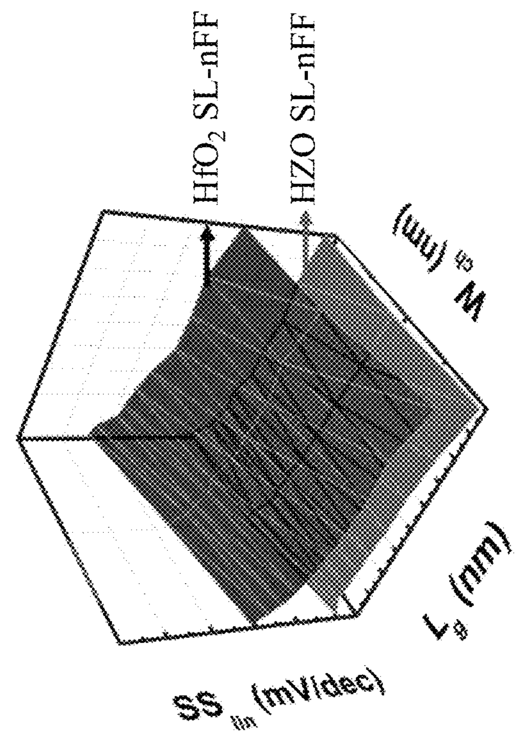
FIG. 27B is a statistic 3D contour plot of $SS_{LIN}$ versus $L_g$ and $W_{ch}$ of n-type transistors having superlattice channels with different gate dielectric layers in accordance with some embodiments of the present disclosure.
Figure 27A:
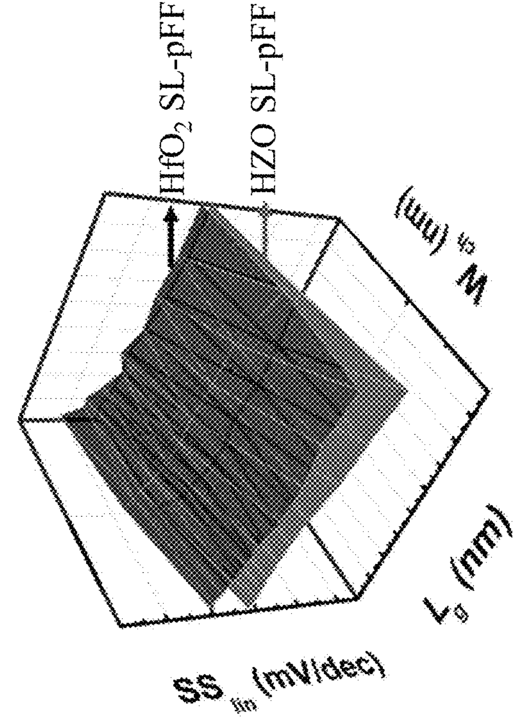
FIG. 27A is a statistic 3D contour plot of $SS_{LIN}$ versus $L_g$ and $W_{ch}$ of p-type transistors having superlattice channels with different gate dielectric layers in accordance with some embodiments of the present disclosure.
Figure 28B:
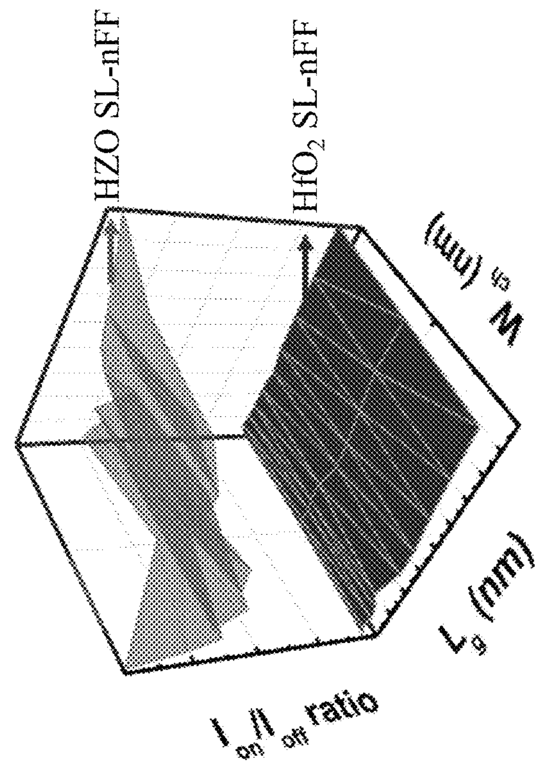
FIG. 28B is a statistic 3D contour plot of $I_{ON}/I_{OFF}$ ratio versus $L_g$ and $W_{ch}$ of n-type transistors having superlattice channels with different gate dielectric layers in accordance with some embodiments of the present disclosure.
Figure 28A:
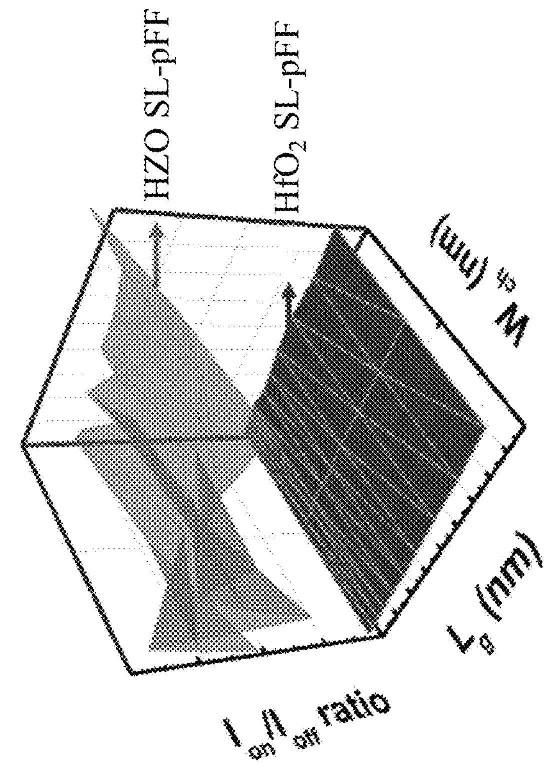
FIG. 28A is a statistic 3D contour plot of $I_{ON}/I_{OFF}$ ratio versus $L_g$ and $W_{ch}$ of p-type transistors having superlattice channels with different gate dielectric layers in accordance with some embodiments of the present disclosure.

FIG. 27A is a statistic 3D contour plot of $SS_{LIN}$ versus $L_g$ and $W_{ch}$ of p-type transistors having superlattice channels with different gate dielectric layers in accordance with some embodiments of the present disclosure. FIG. 27B is a statistic 3D contour plot of $SS_{LIN}$ versus $L_g$ and $W_{ch}$ of n-type transistors having superlattice channels with different gate dielectric layers in accordance with some embodiments of the present disclosure. FIG. 28A is a statistic 3D contour plot of ION/IOFF ratio versus $L_g$ and $W_{ch}$ of p-type transistors having superlattice channels with different gate dielectric layers in accordance with some embodiments of the present disclosure. FIG. 28B is a statistic 3D contour plot of ION/IOFF ratio versus $L_g$ and $W_{ch}$ of n-type transistors having superlattice channels with different gate dielectric layers in accordance with some embodiments of the present disclosure. The statistic 3D contour plots of $SS_{LIN}$ and $I_{ON}/I_{OFF}$ with $L_g$ from 50 nm to 500 nm and $W_{ch}$ from 30 nm to 40 nm show that the HZO SL-pFF and HZO SL-nFF exhibit the lowest $SS_{LIN}$ and the highest ION/IOFF for both n-type and p-type FinFETs.

Figure 29B:
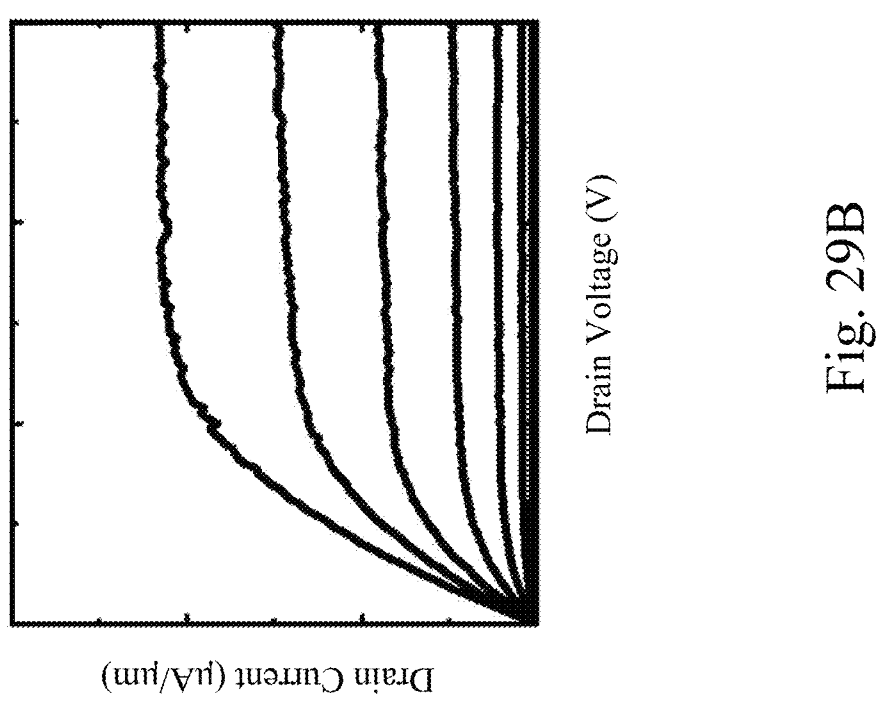
FIG. 29B is a graph of drain current versus drain voltage of n-type GAA transistors having a superlattice channel with a $HfO_2$ gate dielectric layer in accordance with some embodiments of the present disclosure.
Figure 29A:
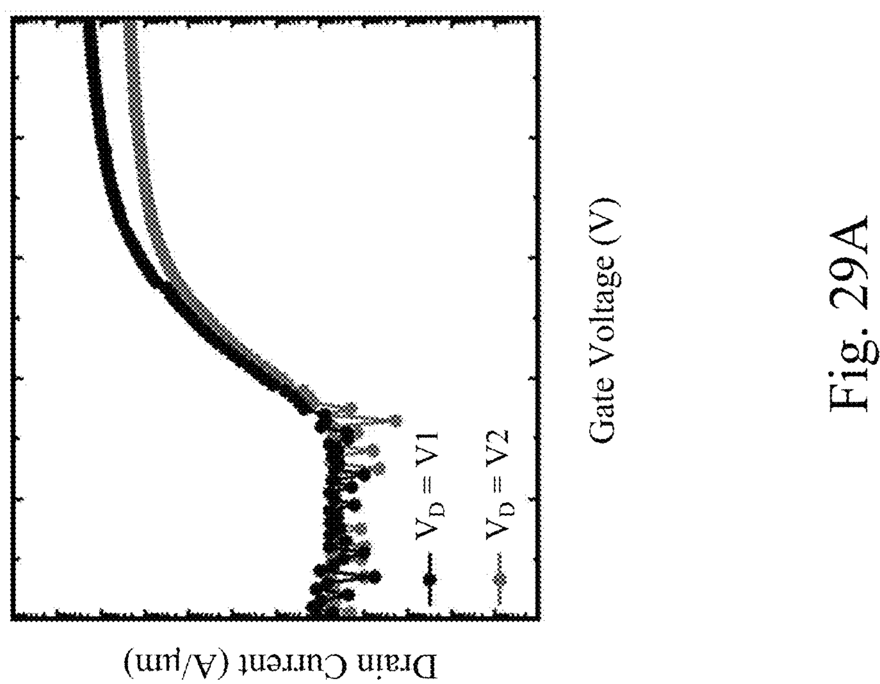
FIG. 29A is a graph of drain current versus gate voltage of n-type GAA transistors having a superlattice channel with a $HfO_2$ gate dielectric layer in accordance with some embodiments of the present disclosure.

FIG. 29A is a graph of drain current versus gate voltage of n-type GAA transistors having a superlattice channel with a $HfO_2$ gate dielectric layer in accordance with some embodiments of the present disclosure. FIG. 29B is a graph of drain current versus drain voltage of n-type GAA transistors having a superlattice channel with a $HfO_2$ gate dielectric layer in accordance with some embodiments of the present disclosure. The super-lattice channel can also be applied on GAAFET, which exhibits low leakage currents and high drive currents.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that SiGe/Si super lattice-like heterostructure has an intrinsic biaxial strain on the high mobility SiGe layer which enable the carrier mobility to become higher. The high mobility in SiGe/Si super lattice-like heterostructure can be observed by Hall measurement. Another advantage is that by applying SiGe/Si super-lattice-like heterostructure on a Si FinFET, which can exhibit improved channel mobility and drive current, and inhibited short channel effect opposing conventional Si FinFET and SiGe FinFET.

According to some embodiments of the present disclosure, a method includes forming an epitaxial stack over a semiconductor substrate, wherein the epitaxial stack comprises a plurality of first semiconductor layers and a plurality of second semiconductor layers alternately arranged over the semiconductor substrate, wherein the first semiconductor layers have a lower germanium concentration than a germanium concentration of the second semiconductor layers; patterning the epitaxial stack into a fin; forming a gate structure over a channel region of the fin, wherein the gate structure is in contact with the first semiconductor layers and the second semiconductor layers within the channel region of the fin; and forming source/drain regions on opposite sides of the channel region of the fin.

According to some embodiments of the present disclosure, a method includes forming an epitaxial stack over a semiconductor substrate, wherein the epitaxial stack comprises a plurality of sacrificial layers and a plurality of multi-layer channel films alternately arranged over the semiconductor substrate, and each of the multi-layer channel films comprises a plurality of first channel layers and a plurality of second channel layers interlaced with each other, wherein the first channel layers have a lower germanium concentration than a germanium concentration of the second channel layers, and the germanium concentration of the second channel layers is lower than a germanium concentration of the sacrificial layers; patterning the epitaxial stack into a fin; removing the sacrificial layers, while leaving the first channel layers and the second channel layers over the semiconductor substrate; and forming a high-k/metal gate structure wrapping around the first channel layers and the second channel layers.

According to some embodiments of the present disclosure, a semiconductor device includes a first multi-layer semiconductor stack and a gate structure surrounding the first multi-layer semiconductor stack. The first multi-layer semiconductor stack comprising a plurality of first semiconductor layers and a plurality of second semiconductor layers interlaced with each other. The first semiconductor layers have a lower germanium concentration than a germanium concentration of the second semiconductor layers. The gate structure comprises a gate dielectric layer and a gate electrode over the gate dielectric layer, and the gate dielectric layer is in contact with sidewalls of the first semiconductor layers and the second semiconductor layers of the first multi-layer semiconductor stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming an epitaxial stack over a semiconductor substrate, wherein the epitaxial stack comprises a plurality of first semiconductor layers and a plurality of second semiconductor layers alternately arranged over the semiconductor substrate, wherein the first semiconductor layers have a lower germanium concentration than a germanium concentration of the second semiconductor layers;

patterning the epitaxial stack into a fin;

forming a gate structure over a channel region of the fin, wherein the gate structure is in contact with the first semiconductor layers and the second semiconductor layers within the channel region of the fin, wherein forming the gate structure comprises forming a gate dielectric layer in contact with sidewalls of the first semiconductor layers and the second semiconductor layers, and forming a gate electrode over the gate dielectric layer; and forming source/drain regions on opposite sides of the channel region of the fin.

2. The method of claim 1, wherein the first semiconductor layers are silicon layers, and the second semiconductor layers are silicon germanium layers.

3. The method of claim 1, wherein the second semiconductor layers are $Si_{1-y}Ge_y$, and y is in a range from 0.1 to 0.4.

4. The method of claim 1, wherein forming the gate dielectric layer is performed such that the gate dielectric layer is in contact with a top surface of a topmost one of the first semiconductor layers in the epitaxial stack.

5. The method of claim 1, wherein forming the gate dielectric layer is performed such that the gate dielectric layer is in contact with a top surface of a topmost one of the second semiconductor layers in the epitaxial stack.

6. The method of claim 1, wherein forming the source/drain regions comprises doping n-type dopants into portions of the first semiconductor layers and the second semiconductor layers uncovered by the gate structure.

7. The method of claim 1, wherein forming the source/drain regions comprises doping p-type dopants into portions of the first semiconductor layers and the second semiconductor layers uncovered by the gate structure.

8. The method of claim 1, wherein a thickness of the second semiconductor layers is greater than a thickness of the first semiconductor layers.

9. The method of claim 1, wherein the gate dielectric layer comprises an oxide material.

10. A method, comprising:

forming an epitaxial stack over a semiconductor substrate, wherein the epitaxial stack comprises a plurality of sacrificial layers and a plurality of multi-layer channel films alternately arranged over the semiconductor substrate, and each of the multi-layer channel films comprises a plurality of first channel layers and a plurality of second channel layers interlaced with each other, wherein the first channel layers have a lower germanium concentration than a germanium concentration of the second channel layers, and the germanium concentration of the second channel layers is lower than a germanium concentration of the sacrificial layers;

patterning the epitaxial stack into a fin;

removing the sacrificial layers, while leaving the first channel layers and the second channel layers over the semiconductor substrate; and forming a high-k/metal gate structure wrapping around the first channel layers and the second channel layers.

11. The method of claim 10, wherein the first channel layers are $Si1_{1-x}Ge_x$, the second channel layers are $Si_{1-y}Ge_y$, and the sacrificial layers are $Si_{1-z}Ge_z$, x, y, and z are in a range from 0 to 1, and $x<y<z$.

12. The method of claim 10, wherein forming the high-k/metal gate structure comprises:

forming a gate dielectric layer in contact with sidewalls of the first channel layers and the second channel layers; and forming a gate metal layer over the gate dielectric layer.

13. The method of claim 10, further comprises:

after patterning the epitaxial stack into the fin, forming a recess in the fin to expose end surfaces of the first channel layers and the second channel layers; and forming a source/drain epitaxial structure in the recess.

14. The method of claim 13, wherein forming the source/drain epitaxial structure is performed such that the source/drain epitaxial structure are in contact with the exposed end surfaces of the first channel layers and the second channel layers.

15. A semiconductor device, comprising:

a first multi-layer semiconductor stack comprising a plurality of first semiconductor layers and a plurality of second semiconductor layers interlaced with each other, wherein the first semiconductor layers have a lower germanium concentration than a germanium concentration of the second semiconductor layers; and a gate structure surrounding the first multi-layer semiconductor stack, wherein the gate structure comprises a gate dielectric layer and a gate electrode over the gate dielectric layer, and the gate dielectric layer is in contact with sidewalls of the first semiconductor layers and the second semiconductor layers of the first multi-layer semiconductor stack.

16. The semiconductor device of claim 15, further comprises:

a second multi-layer semiconductor stack above the first multi-layer semiconductor stack, the second multi-layer semiconductor stack comprising a plurality of third semiconductor layers and a plurality of fourth semiconductor layers interlaced with each other, wherein the third semiconductor layers have a lower germanium concentration than a germanium concentration of the fourth semiconductor layers, wherein the gate structure surrounds the second multi-layer semiconductor stack, and the gate dielectric layer is in contact with sidewalls of the third semiconductor layers and the fourth semiconductor layers of the second multi-layer semiconductor stack.

17. The semiconductor device of claim 15, further comprises:

source/drain regions in the first multi-layer semiconductor stack and on opposite sides of the gate structure.

18. The semiconductor device of claim 15, further comprises:

source/drain epitaxial structures on opposite sides of the first multi-layer semiconductor stack.

19. The semiconductor device of claim 15, wherein the gate dielectric layer is in contact with a top surface of a topmost one of the first semiconductor layers.

20. The semiconductor device of claim 15, wherein the gate dielectric layer is in contact with a top surface of a topmost one of the second semiconductor layers.

* * * * *